United States Patent
Nakazawa et al.

(10) Patent No.: US 8,692,345 B2
(45) Date of Patent: Apr. 8, 2014

(54) IMAGE SENSING DEVICE, IMAGE SENSING SYSTEM, AND METHOD FOR MANUFACTURING IMAGE SENSING DEVICE

(75) Inventors: Toru Nakazawa, Atsugi (JP); Hiroaki Kobayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 13/566,781

(22) Filed: Aug. 3, 2012

(65) Prior Publication Data

US 2013/0037902 A1 Feb. 14, 2013

(30) Foreign Application Priority Data

Aug. 9, 2011 (JP) .................................. 2011-173963

(51) Int. Cl.
*H01L 31/0232* (2006.01)

(52) U.S. Cl.
USPC ..... 257/432; 257/294; 257/435; 257/E31.122

(58) Field of Classification Search
USPC .......... 257/294, 432, 435, E31.119, E31.122, 257/E31.127; 438/69
See application file for complete search history.

(56) References Cited

U.S. PATENT DOCUMENTS

| | | | |
|---|---|---|---|
| 6,259,083 B1 * | 7/2001 | Kimura | 250/208.1 |
| 6,781,210 B2 * | 8/2004 | Sugimoto et al. | 257/435 |
| 8,237,237 B2 * | 8/2012 | Wano et al. | 257/432 |
| 2001/0054677 A1 | 12/2001 | Nakashima | |
| 2006/0163628 A1 | 7/2006 | Mori | |
| 2008/0087921 A1 | 4/2008 | Yu | |
| 2008/0203509 A1 | 8/2008 | Mishima | |
| 2009/0189236 A1 | 7/2009 | Hayashi | |
| 2011/0242376 A1 * | 10/2011 | Ando | 348/294 |
| 2013/0161774 A1 * | 6/2013 | Okigawa | 257/432 |

FOREIGN PATENT DOCUMENTS

| | | |
|---|---|---|
| JP | 2001-284566 A | 10/2001 |
| JP | 2006-210582 A | 8/2006 |
| JP | 2007-184311 A | 7/2007 |
| JP | 2008-210868 A | 9/2008 |
| JP | 2009-146957 A | 7/2009 |
| JP | 2009-218374 A | 9/2009 |
| JP | 2009-283482 A | 12/2009 |
| JP | 2010-135842 A | 6/2010 |

* cited by examiner

*Primary Examiner* — Tuan N. Quach
(74) *Attorney, Agent, or Firm* — Canon U.S.A., Inc. IP Division

(57) ABSTRACT

An image sensing device includes a light-shielding film having transit portions, a first film and a second film. The second film comprises a first layer having a different refractive index from the first film. The first layer lies within at least the transit portions, and forms interfaces with the first film. The distance between the interface and the corresponding photoelectric conversion portion is greater than the distance between the photoelectric conversion portion and the lower end of the corresponding transit portion.

17 Claims, 10 Drawing Sheets

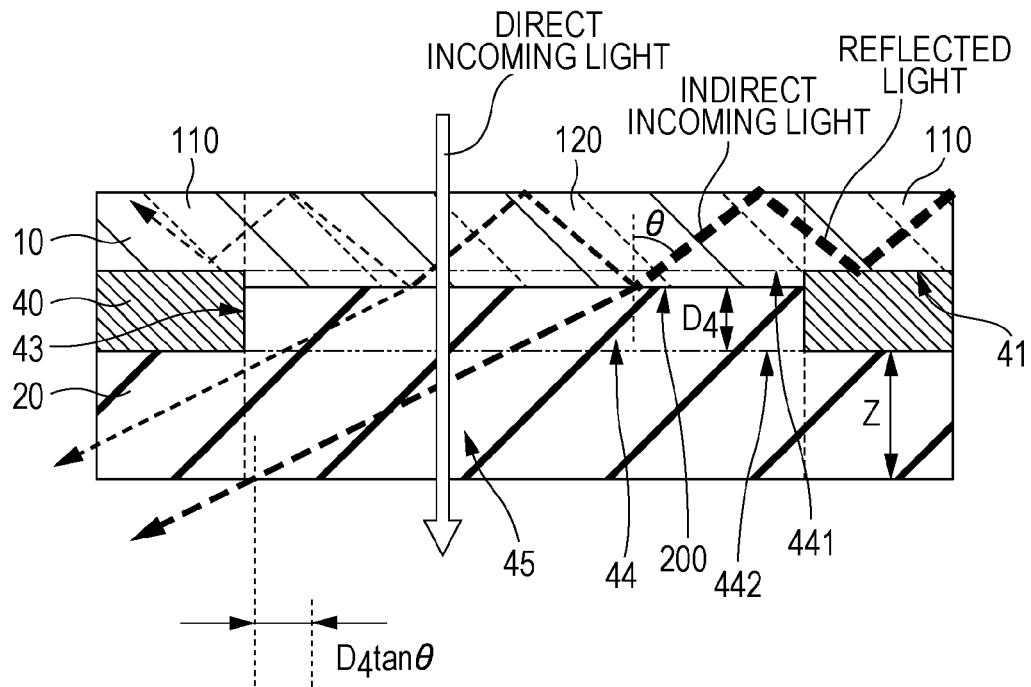
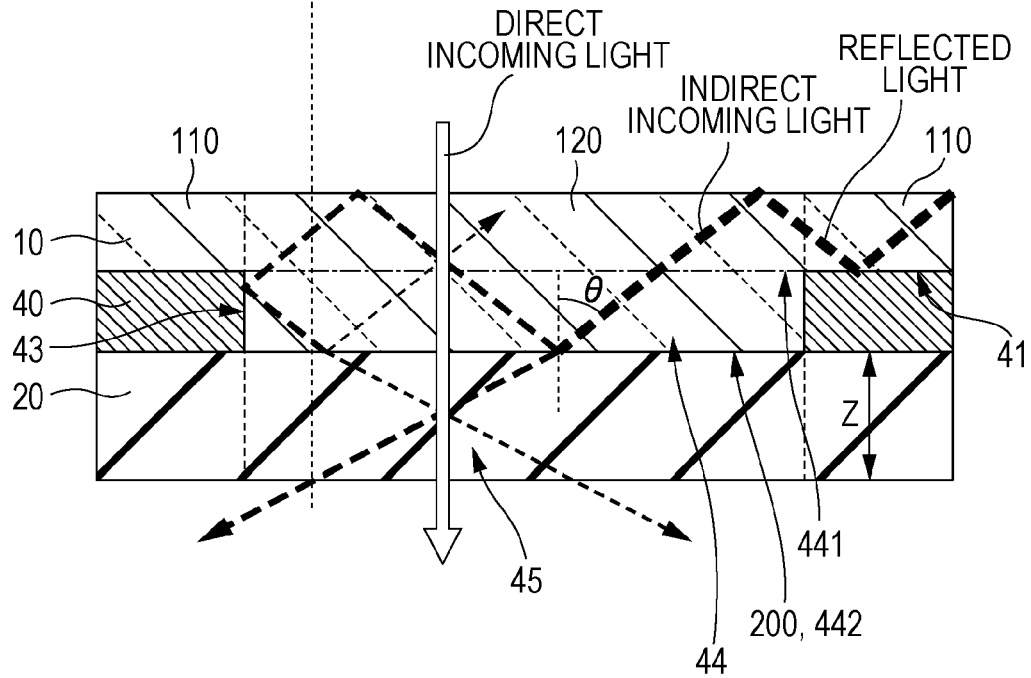

IMAGE SENSING DEVICE, IMAGE SENSING SYSTEM, AND METHOD FOR MANUFACTURING IMAGE SENSING DEVICE

BACKGROUND

1. Field of the Invention

The present invention relates to an image sensing device including a light-shielding film.

2. Description of the Related Art

An image sensing device including a plurality of photoelectric conversion portions is provided with a light-shielding film so as to define transit portions through which light (visible light) enters the corresponding photoelectric conversion portions. Thus, light is inhibited from entering undesirable portions. Japanese Laid-Open Patent No. 2001-284566 describes a sold-state image sensing device having an aluminum light-shielding film; FIG. 1 shows a passivation film 5 in contact with light-shielding film 4 and FIG. 2 shows a silicon oxide film 10 in contact with light-shielding film 4. Japanese Laid-Open Patent Nos. 2009-218374 and 2009-283482 describe image sensing devices having a light-shielding-pixel region having a copper light-shielding film.

A metal light-shielding film reflects light incident on the light-shielding film. The light reflected from the light-shielding film propagates in the image sensing device and, in some cases, enters some of the photoelectric conversion portions. A large part of the light reflected from the light-shielding film probably propagates through a film adjacent to the light-shielding film, and can enter the photoelectric conversion portions. If reflected light enters a photoelectric conversion portion, the photoelectric conversion portion may produce an undesired signal, that is, noise. This noise can adversely affect the resulting image.

SUMMARY

According to an aspect of the invention, an image sensing device is provided. The image sensing device includes a substrate having a plurality of photoelectric conversion portions, a first film disposed over the substrate and covering the photoelectric conversion portions, and a light-shielding film disposed between the first film and the substrate. The light-shielding film has apertures for the photoelectric conversion portions. Each of the apertures acts as a transit portion through which visible light enters a corresponding photoelectric conversion portion. The light-shielding film has an upper surface and a side wall. The upper surface faces the first film such that the first film is closely adjacent to the upper surface, and the side wall faces the transit portion. The image sensing device also includes a second film disposed between the first film and the substrate. The second film includes a first layer having a refractive index different from the first film. The first layer lies within at least the transit portions and forms interfaces with the first film. At least one of the upper surface and the side wall is made of a material having a maximum spectral reflectance for visible light of 75% or less. The material of the upper surface has a minimum spectral reflectance for visible light of ¾ or more of the maximum. The distance between the interface and the corresponding photoelectric conversion portion is greater than the distance between the photoelectric conversion portion and the lower end of the corresponding transit portion.

According to another aspect of the invention, an image sensing device is provided which includes a substrate having a plurality of photoelectric conversion portions, a first film disposed over the substrate and covering the photoelectric conversion portions, and a light-shielding film disposed between the first film and the substrate. The light-shielding film has apertures for the photoelectric conversion portions. Each aperture acts as a transit portion through which visible light enters the corresponding photoelectric conversion portion. The light-shielding film has an upper surface and a side wall. The upper surface faces the first film such that the first film is closely adjacent to the upper surface, and the side wall faces the transit portion. The image sensing device also includes a second film disposed between the first film and the substrate. The second film includes a silicon oxide layer lying within at least the transit portions. The silicon oxide layer forms interfaces with the first film. The upper surface may be mainly made of aluminum, and in this instance, the side wall is mainly made of titanium or titanium nitride. Alternatively, the upper surface may be mainly made of tungsten. The distance between the interface and the corresponding photoelectric conversion portion is greater than the distance between the photoelectric conversion portion and the lower end of the corresponding transit portion.

According to yet another aspect of the invention, a method for manufacturing an image sensing device is provided. The method includes forming a silicon oxide-based layer covering a substrate including a plurality of photoelectric conversion portions, forming a light-shielding film having a plurality of apertures by embedding aluminum or tungsten in a trench of the silicon oxide-based layer by a Damascene process, and forming at least one of a silicon nitride-based layer and a silicon oxynitride-based layer on the light-shielding film so as to cover the substrate.

Further features of the present invention will become apparent from the following description of exemplary embodiments with reference to the attached drawings.

BRIEF DESCRIPTION OF THE DRAWINGS

FIGS. 4A and 4B are schematic representations of embodiments of the invention.

DESCRIPTION OF THE EMBODIMENTS

First Embodiment

Figure 1:
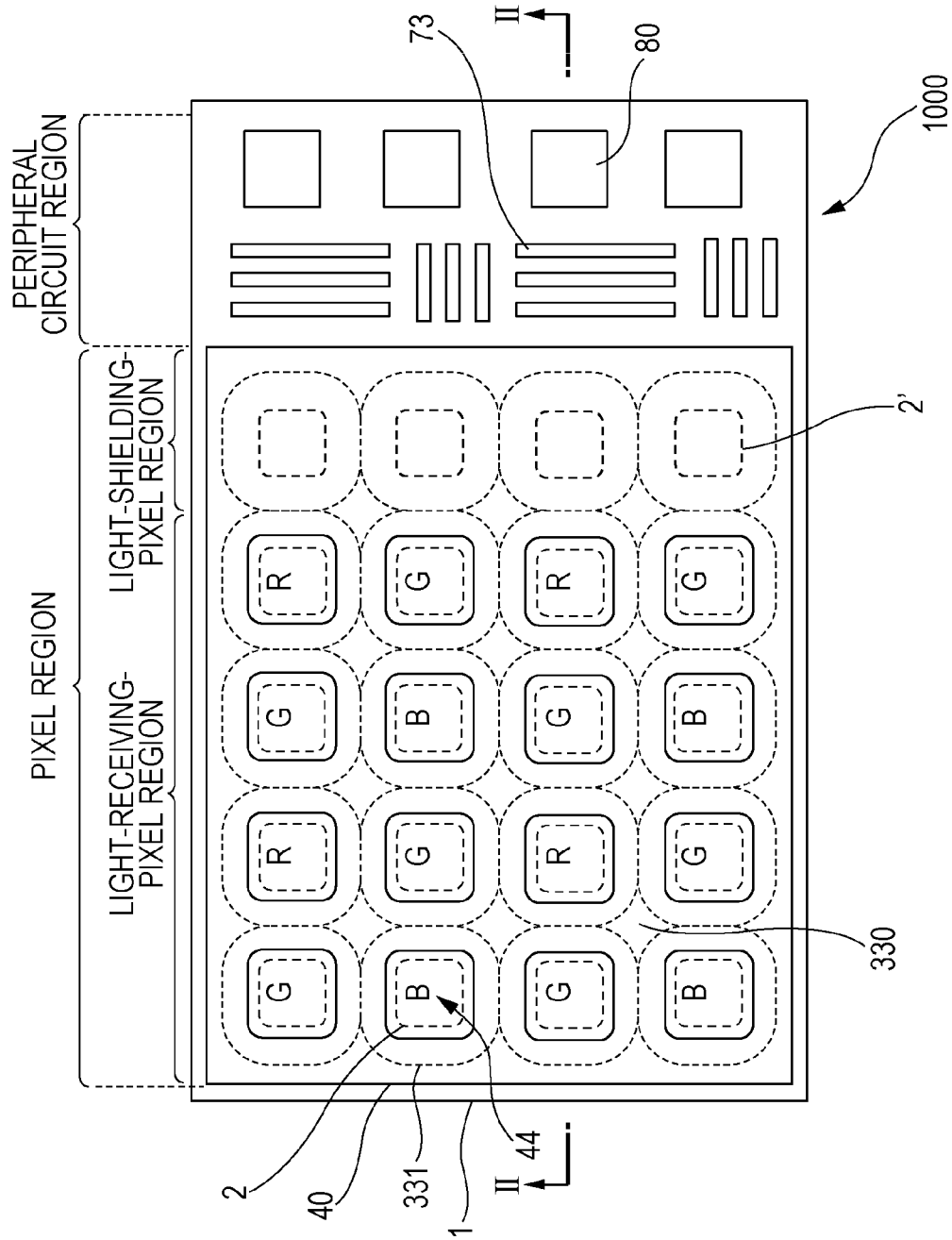
FIG. 1 is a schematic plan view of an image sensing device according to a first embodiment of the invention.
Figure 2:
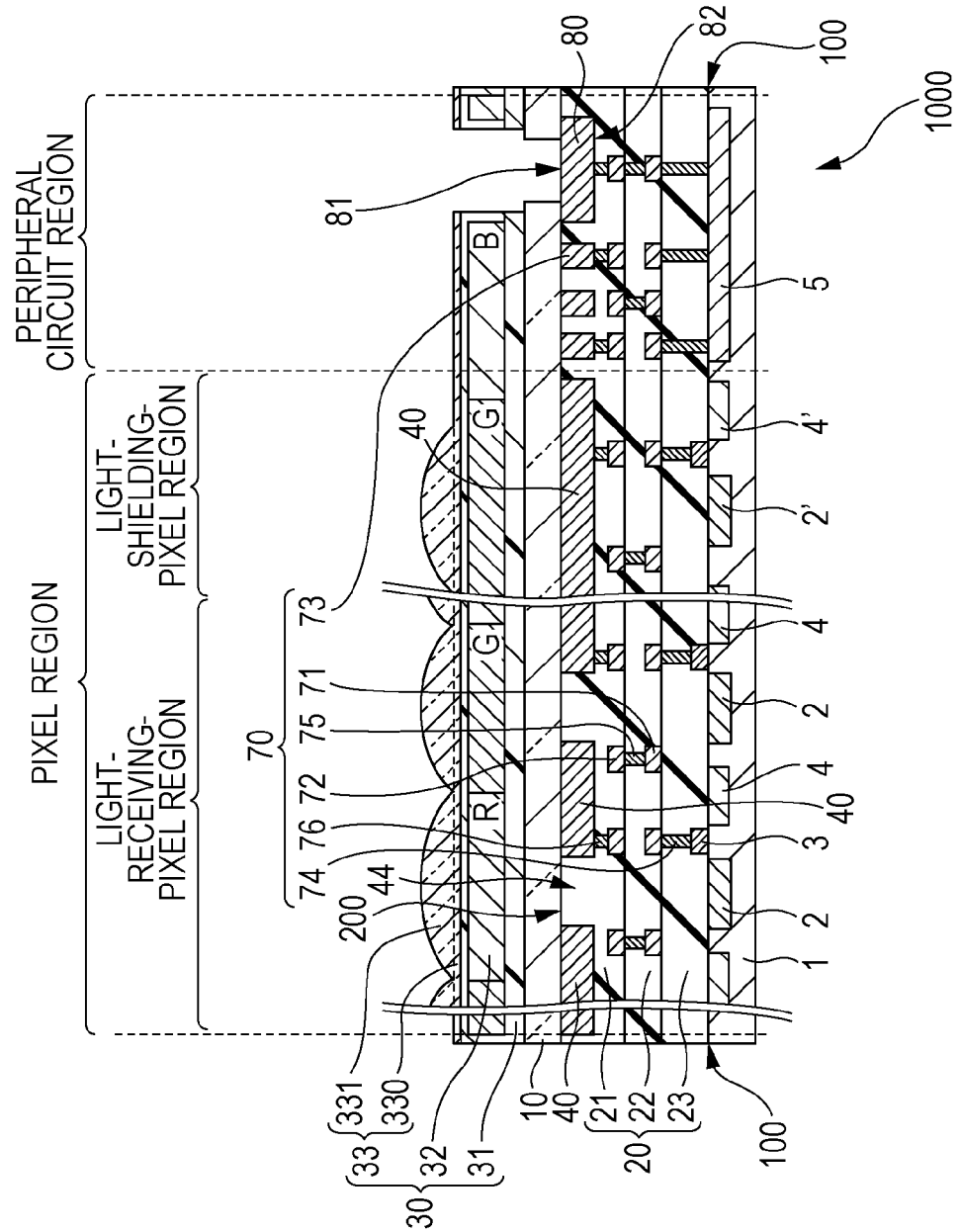
FIG. 2 is a schematic sectional view of the image sensing device according to the first embodiment.
Figure 3:
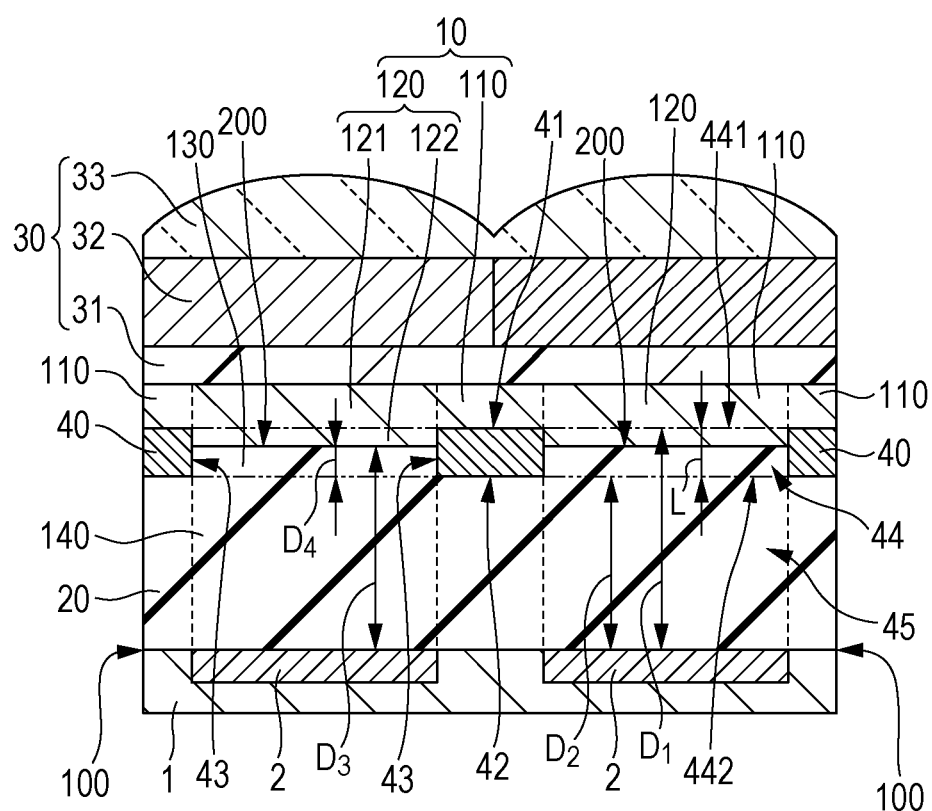
FIG. 3 is a schematic enlarged sectional view of an image sensing device according to a modification of the first embodiment.

An image sensing device according to a first embodiment of the invention will now be described with reference to FIGS. 1 to 3. FIG. 1 is a schematic plan view of an image sensing device 1000, and FIG. 2 is a schematic sectional view of the image sensing device 1000, taken along line II-II of FIG. 1. FIG. 3 is a schematic enlarged view of the main part of the image sensing device 1000, fragmentarily illustrating the structure shown in FIG. 2. The same parts shown in FIGS. 1 to 3 are designated by the same reference numerals, and these can be cross-referenced to each other. For the sake of simplicity, some of the parts shown in FIGS. 1 and 2 are omitted in FIG. 3.

As shown in FIG. 1, the image sensing device 1000 has a pixel region in which a plurality of pixels is arranged. Although in the pixel region shown in FIG. 1, 20 pixels are arranged in a 4×5 two-dimensional matrix, the pixels may be linearly arranged. In the embodiment shown in FIG. 1, the image sensing device 1000 has a peripheral circuit region in addition to the pixel region. Each pixel has a photoelectric conversion portion 2 indicated by a dotted line shown in FIG. 1. The image sensing device 1000 includes a substrate 1 made of silicon or other semiconductor materials, having a plurality of photoelectric conversion portions 2 disposed therein. The principal plane 100 of the image sensing device 1000 is defined by light-receiving surfaces of the photoelectric conversion portions 2. More specifically, the principal plane 100 includes the light-receiving surfaces of the photoelectric conversion portions 2 and is an imaginary plane parallel to the light-receiving surfaces. In other words, the principal plane 100 is parallel to the substrate 1. In many configurations, the surface of a semiconductor substrate 1 includes the light-receiving surfaces of the photoelectric conversion portions 2. In other configurations, the photoelectric conversion portions may be formed by forming a thin film having a Metal-Insulator-Semiconductor (MIS) or an intrinsic semiconductor between a p-type semiconductor and an n-type semiconductor (PIN) structure on the surface of a glass substrate. In this instance, the principal plane of the image sensing device lies away from the surface of the glass substrate at a distance equal to the thickness of the thin film.

As shown in FIG. 2, the image sensing device 1000 includes a first film 10, a light-shielding film 40, and a second film 20, in addition to the substrate 1 and the photoelectric conversion portions 2. The image sensing device 1000 may further include a third film 30, a wiring structure 70, electrode pads 80, control electrodes 3, pixel circuit portions 4, second photoelectric conversion portions 2' other than the photoelectric conversion portions 2 (hereinafter referred to as the first photoelectric conversion portions 2), second pixel circuit portions 4' other than the pixel circuit portions 4 (hereinafter referred to as the first pixel circuit portions 4), and a peripheral circuit portion 5. The pixel region includes a light-receiving-pixel region in which light-receiving pixels are arranged, and a light-shielding-pixel region in which light-shielding pixels are arranged. Each light-receiving pixel includes the first photoelectric conversion portion 2 and the first pixel circuit portion 4, and each light-shielding pixel includes the second photoelectric conversion portion 2' and the second pixel circuit portion 4'. In the embodiment shown in FIG. 1, sixteen light-receiving pixels are arranged in a 4×4 matrix in the light-receiving-pixel region, and four light-shielding pixels are arranged in the light-shielding-pixel region. Thus, the substrate 1 contains a plurality of photoelectric conversion portions including two or more first photoelectric conversion portions 2 and one or more second photoelectric conversion portions 2'. Although the illustrated embodiment shows a structure in which the light-receiving-pixel region and the light-shielding-pixel region are arranged in a single direction, in other embodiments the light-shielding-pixel region may extend in four directions so as to surround the light-receiving-pixel region. Similarly, the peripheral circuit region may surround the pixel region. The peripheral circuit portion 5 and the electrode pads 80 are disposed in the peripheral circuit region. In the present embodiment, the third film 30 includes an intermediate layer 31, a color filter layer 32, and a microlens layer 33. The pixels each include the photoelectric conversion portion 2 or 2', the first film 10, the light-shielding film 40 and the second film 20. In addition, the pixel further includes the third film 30, the control electrode 3 and the pixel circuit portion 4 or 4'. The image sensing device 1000 of the present embodiment may be considered a CMOS image sensor.

In the following description, the words "layer" and "film" are differentiated as defined below. A "layer" is made of a substantially homogeneous material and has no interfaces therein. However, two adjacent layers have an interface therebetween. This interface is formed, even if the two layers are formed of the same material, when the two layers are formed, for example, by different methods or under different conditions, or when the two layers are formed by a process including a step that can cause some change at the surface of one of the layers between the steps of forming one of the layers and forming the other. On the other hand, a "film" may have a single-layer structure defined by a single layer, or have a multilayer structure including a plurality of layers. In the following description, the direction from the substrate 1 toward the top surface (through which light enters) of the image sensing device 1000 is the upper direction, and the direction from the top surface of the image sensing device 1000 toward the substrate 1 is the lower direction. Only visible light (having wavelengths of 400 to 760 nm) is used in the present embodiment. Although in some cases not only visible light, but also infrared light or ultraviolet light, may enter the image sensing device 1000, it is assumed, for convenience sake, that only visible light enters the image sensing device 1000. In the following description, red light has a wavelength of 610 to 750 nm, green light has a wavelength of 500 to 560 nm, and blue light has a wavelength of 435 to 480 nm. When red, green and blue color filters are used, in a precise sense, it can be considered that light incident on the light-shielding film 40 has dominant wavelengths (peak wavelengths) of light that passes through the color filters. When color filters or a plurality of types of monochromatic filters are not used, or when complementary monochromatic filters are used, it can be considered that red, green and blue light have wavelengths of 700 nm, 546 nm and 436 nm, respectively.

Turning now to FIG. 3, the first film 10, the second film 20 and the light-shielding film 40 will be described in detail. FIG. 3 shows a modification of the first embodiment and is different from the structure shown in FIG. 2 in the arrangement of the first film 10 and the second film 20. Other parts are the same as FIG. 2.

The first film 10 is disposed over the substrate 1, and is made of a material (transparent material) having such high optical transparency that light enters the photoelectric conversion portions 2. In terms of optical characteristics, the first film 10 is a transparent film (first transparent film). The first film 10 can be formed of an inorganic material, and is typically made of a silicon compound mainly containing silicon oxynitride (SiON) or silicon nitride (SiN). The second film 20 is disposed over the substrate 1, and is made of a material (transparent material) having such high optical transparency that light enters the photoelectric conversion portions 2. In terms of optical characteristics, the first film 20 is a transparent film (second transparent film). The second film 20 can be formed of an inorganic material, and is typically made of a silicon compound mainly containing silicon oxide. The light-shielding film 40 is made of a material having lower optical transparency than the first film 10 and the second film 20, and is disposed over the substrate 1. The light-shielding film 40 can be formed of an inorganic material, and is typically made of a metal (elemental metal or alloy) or a metal compound. The light-shielding film 40 is located between the first film 10 and the substrate 1, and the second film 20 is located between the first film 10 and the substrate 1. The second film 20 also lies between the light-shielding film 40 and the substrate 1.

The light-shielding film 40 defines transit portions 44, through which light enters the corresponding photoelectric conversion portions 2. Thus, part of the light that has entered the image sensing device 1000 (in the present embodiment, light coming through the microlens layer 33) passes through the transit portion 44 for each pixel and enters the photoelectric conversion portion 2 through the light path portion 45 between the transit portion 44 and the photoelectric conversion portion 2. In the present embodiment, the transit portion 44 is continuously surrounded by the side wall 43 of the light-shielding film 40, and the light-shielding film 40 continuously extends between each transit portion 44, as shown in FIGS. 1 and 3. In other words, the light-shielding film 40 is a latticed film having a plurality of apertures (through holes), each corresponding to the transit portion 44. Although the shape of the aperture is shown as a rounded square in FIG. 1, it may be circular or polygonal. The side wall 43 of the light-shielding film 40 faces the transit portion 44. The transit portion 44 has an entrance 441 at the upper end of the aperture (indicated by a dotted chain line in FIG. 3) and an exit 442 at the lower end of the aperture (indicated by a double-dotted chain line in FIG. 3). The entrance 441 of the transit portion 44 is located in an imaginary plane parallel to and including the upper surface 41 of the light-shielding film 40. The exit 442 of the transit portion 44 is located in an imaginary plane parallel to and including the lower surface 42 of the light-shielding film 40. Hence, the distance $D_1$ between the entrance 441 of the transit portion 44 and the light-receiving surface of the photoelectric conversion portion 2 is substantially the same as the distance between the upper surface 41 of the light-shielding film 40 and the principal plane 100 of the image sensing device. Also, the distance $D_2$ between the exit 442 of the transit portion 44 and the light-receiving surface of the photoelectric conversion portion 2 is substantially the same as the distance between the lower surface 42 of the light-shielding film 40 and the principal plane 100 of the image sensing device. The length L of the transit portion 44, which is expressed by $D_1-D_2$, is substantially the same as the thickness of the light-shielding film 40. Distance $D_2$ can also be referred to as the distance between the transit portion 44 and the photoelectric conversion portion 2.

Part of the light that has entered the image sensing device 1000 comes incident on the upper surface 41 of the light-shielding film 40. The incident light is reflected at the upper surface 41 of the light-shielding film 40. Hence, the upper surface 41 of the light-shielding film 40 is a reflection plane. The upper surface 41 of the light-shielding film 40 is made of a material having a silver color (silver-color material). The silver-color material mentioned herein refers to a material showing silver color with white light entering in the vertical direction in the air. More specifically, the silver-color material exhibits such reflection as the minimum (minimum spectral reflectance) of the reflectances (spectral reflectances) for visible light rays is ¾ or more of the maximum (maximum spectral reflectance) of the reflectances. For example, when incident light on the light-shielding film 40 is substantially limited to blue, green and red light, the lowest reflectance for these color lights is ¾ or more of the highest reflectance. For details of the colors of materials, chemistry handbooks can be consulted. As the reflectance of the upper surface 41 of the light-shielding film 40 is increased, a more marked effect can be produced. For example, materials exhibiting spectral reflectances of more than 75% for red, green and blue light may accommodate to the high reflectance of the upper surface 41 of the light-shielding film 40. On the other hand, as the reflectance of the upper surface 41 of the light-shielding film 40 is decreased, the influence of reflected light is reduced. For example, materials exhibiting spectral reflectances of less than 25% for red, green and blue light may accommodate to the low reflectance of the upper surface 41 of the light-shielding film 40. In this embodiment, suitable materials for the upper surface 41 of the light-shielding film 40 exhibit spectral reflectances of 25% or more and 75% or less, or exhibit spectral reflectances of more than 75%.

Portions of the first film 10 closely adjacent to the upper surface 41 of the light-shielding film 40 are referred to as first portions 110. More specifically, the first portion 110 is the overlap of the first film 10 with the light-shielding film 40 when the first film 10 is orthogonally projected in the direction from the principal plane 100 to the light-shielding film 40. The upper surface 41 of the light-shielding film 40 faces the first portion 110 of the first film 10. The light-shielding film 40 is located between the first portion 110 and the substrate 1.

In the present embodiment, the first portion 110 is in contact with the upper surface 41 of the light-shielding film 40; in other words, the distance between the first portion 110 and the upper surface 41 is zero. However, a case where the first portion 110 and the upper surface 41 are slightly separate from each other can be considered to be closely adjacent to each other. More specifically, when the first portion 110 and the upper surface 41 of the light-shielding film 40 have an optical length therebetween smaller than or equal to the wavelength of incident light on the upper surface 41, the first portion can be considered to be closely adjacent to the upper surface 41 of the light-shielding film 40. If the first portion 110 and the upper surface 41 are separated by a layer, the optical length between the first portion 110 and the upper surface 41 is a product of the refractive index and the thickness of the layer between the first portion 110 and the upper surface 41. More specifically, when n (n≥0) layers, of which the k-th layer (0≤k≤n) has a refractive index of $N_k$ and a thickness of $T_k$, are disposed between the first portion 110 and the upper surface 41, the optical length $D_O$ is expressed by the following equation:

$$D_O = \sum_{k=0}^{n} N_k T_k \quad \text{(Equation 1)}$$

In Equation 1, $N_0=0$ and $T_0=0$ hold true. In the present embodiment, $n=0$ and $D_O=0$ hold true. Since the wavelength of the incident light is 400 to 760 nm in the present embodiment, the optical length between the first portion 110 and the upper surface 41 of the light-shielding film 40 is at most 760 nm. It is desirable that the optical length between the first portion 110 and the upper surface 41 be smaller than or equal to all the wavelengths of incident light, and accordingly, the optical length between the first portion 110 and the upper surface 41 is preferably 400 nm or less. For example, when a layer having a refractive index of 1.5 is disposed between the first portion 110 and the upper surface 41, the thickness of this layer is 506 nm or less, and preferably 266 nm or less.

Portions of the first film 10, corresponding to the transit portions 44, are referred to as second portions 120. More specifically, the second portion 120 is the portion not overlapped with the first film 10 when the first film 10 is orthogonally projected in the direction from the principal plane 100 to the light-shielding film 40. The light-shielding film 40 is not present between the second portion 120 and the substrate 1, but at least part of the transit portion 44 and the light path portion 45 is present between the second portion 120 and the substrate 1. In the present embodiment, the upper portion 121 of the second portion 120 lies outside the transit portion 44 (over the entrance 441), and hence, the upper portion 121 covers the transit portion 44. The lower portion 122 of the second portion 120 lies within the transit portion 44 without covering the transit portion 44. In this structure, the entrance 441 of the transit portion 44 can be considered to be a boundary between the upper portion 121 and the lower portion 122 of the second portion 120. The first portion 110 is continuous with the second portion 120 as a layer. The first portions 110 connect the second portions 120, with each second portion 120 corresponding to one of the transit portions 44.

Portions of the second film 20 lying within the transit portions 44 are referred to as third portions 130. Portions of the second film 20 lying within the light path portions 45 are referred to as fourth portions 140. The exit 442 of the transit portion 44 can be considered to be a boundary between the third portion 130 and the fourth portion 140.

The relationship between the first film 10 and the second film 20 will be further described with reference to FIG. 3.

The second portion 120 of the first film 10 and the third portion 130 of the second film 20 are in contact with each other, and thus have an interface 200 therebetween. The interface 200 and the photoelectric conversion portion 2 (and the principal plane 100) have a distance $D_3$. In the present embodiment, the distance $D_3$ between the interface 200 and the photoelectric conversion portion 2 is larger than the distance $D_2$ between the exit 442 of the transit portion 44 and the photoelectric conversion portion 2. Hence $D_3 > D_2$ holds true. The distance $D_4$ from the interface 200 to the exit 442 of the transit portion 44 is $D_3 - D_2$. FIG. 3 shows a case of $D_4 < L$, and FIG. 2 shows a case of $D_4 = L$. The interface 200 between the first film 10 and the second film 20 may be more distant from the photoelectric conversion portion 2 than the middle between the entrance 441 and the exit 442. More specifically, it is desirable to satisfy the relationship $D_3 > D_2 + L/2 = (D_1 + D_2)/2$, that is, $D_4 > L/2 = (D_1 - D_2)/2$.

In addition, it is undesirable that the interface 200 be excessively distant from the entrance 441, and it is desirable to satisfy the relationship $D_3 < D_2 + 2L = 2D_1 - D_2$, that is, $D_4 < 2L = 2(D_1 - D_2)$. It is further desirable to satisfy the relationship $D_3 < D_2 + (3/2)L = 3D_1 - D_2$, that is, $D_4 < (3/2)L = 3(D_1 - D_2)/2$.

Accordingly, it is desirable that the distance between the interface 200 and the entrance 441 be smaller than the distance between the entrance 441 and the exit 442, that is, it is desirable to satisfy the relationship $|D_3 - D_1| < (D_1 - D_2) = L$. Also, it is more desirable that the distance between the interface 200 and the entrance 441 be smaller than half of the distance between the entrance 441 and the exit 442, that is, it is desirable to satisfy the relationship $|D_3 - D_1| < (D_1 - D_2)/2 = L/2$.

In particular, the interface 200 preferably lies at the same level as the entrance 441 of the transit portion 44 ($D_4 = L$), as shown in FIG. 2. Hence $D_3 = D_1$ is desirable. In the structure shown in FIG. 2, the second portion 120 does not lie in the transit portion 44; the entirety of the second portion 120 covers the transit portion 44.

The refractive index of the first film 10 (second portion 120) is different from that of the second film 20 (third portion 130). Hence, the refractive index is different between the upper and lower portions of the interface 200. When the refractive index of the second portion 120 is 0.95 to 1.05 times the refractive index of the third portion 130, the difference between these two refractive indices is considered to be significant. Although the refractive index of the first film 10 may be lower than that of the second film 20, the refractive index of the first film 10 is preferably higher than that of the second film 20. Typically, the third portion 130 is made of a different material from the second portion 120. However, materials having the same stoichiometric composition can have significantly different refractive indices when they have different nonstoichiometric compositions or when films of the materials have different properties by being formed in different processes.

The above-described structure can provide satisfactory images. The reason(s) for this, and phenomena that can occur in the structure will be described with reference to FIGS. 3 and 4A and 4B. FIG. 4A is a fragmentary schematic enlarged view of FIG. 3, showing the vicinity of the interface 200. FIG. 4B is a schematic view of a comparative structure, similar to FIG. 4A. In the structure shown in FIG. 4B, the interface 200 between the first film 10 and the second film 20 coincides with the exit 442 of the transit portion 44.

First, the reflection from the light-shielding film 40 in FIG. 3 will be described.

Part of the incoming light to the pixel region of the image sensing device 1000 enters the first portion 110 of the first film 10 from the upper side of the first film 10. The light that has entered the first portion 110 comes incident on the upper surface 41 of the light-shielding film 40, and is reflected at the upper surface 41. The reflected light enters the first portion 110 again. Then, at least part of the reflected light propagates in the first film 10 from the first portion 110 to the second portion 120 and comes incident on the interface 200 from the second portion 120. For convenience, light that reflects from the upper surface 41 and enters through the interface 200 is referred to as indirect incoming light. Hence, the upper surface 41 of the light-shielding film 40 is a surface on which light is incident, and is also a reflection plane at which the incident light is reflected. On the other hand, the lower surface 42 of the light-shielding film 40 is a light-shielding surface.

Other part(s) of the incoming light to the pixel region of the image sensing device 1000 enter the second portion 120 of the first film 10 from the upper side of the first film 10. The light that has entered the second portion 120, at least in part, enters through the interface 200 without coming incident on the upper surface 41 of the light-shielding film 40. For convenience, light entering through the interface 200 without being reflected at the upper surface 41 of the light-shielding film 40 is referred to as direct incoming light. In FIGS. 4A and 4B, the direct incoming light is indicated by a solid line, and some of the indirect incoming light rays are indicated by broken lines. For the indirect incoming light, the thicker the broken line, the higher the light intensity. The broken lines schematically show the changes in intensity caused by reflection or transmission.

Incident light on the interface 200 passes through the interface 200 and propagates to the photoelectric conversion portion 2 through the transit portion 44, thus easily entering the photoelectric portion 2. Direct incoming light should enter the photoelectric conversion portion 2, and indirect incoming light should not enter the photoelectric conversion portion 2. Indirect incoming light may include light rays that should enter other pixels. In general, from the viewpoint of enhancing sensitivity, the image sensing device 1000 is designed so that almost all the incoming light rays to the pixel region are direct incoming light rays. However, incoming light rays include indirect incoming rays to some extent, and indirect incoming light should not be ignored from the viewpoint of enhancing image quality. Accordingly, it is effective that the amount of indirect incoming light passing through the interface 200 is minimized.

As described above, the refractive index is different between the upper and lower portions of the interface 200. Since light is reflected at interfaces between media having different refractive indices, the interface 200 between the first film 10 and the second film 20 acts as a barrier against incoming light to the interface 200. Therefore, the interface 200 reduces the amount of light passing through the interface 200. At this time, the larger the difference in refractive index between the first film 10 and the second film 20, the higher the intensity reflectance. Thus, the amount of light that will pass through the interface 200 is reduced. Also, the intensity reflectance tends to increase as the incident angle on the interface 200 is increased.

The angle of the propagation direction of reflected light with the normal to the principal plane 100 is generally larger than the angle of the propagation direction of direct incoming light with the normal to the principal plane 100. This is because the first film 10 extends substantially parallel to the principal plane 100, and because a large part of the incoming light to the image sensing device 1000 enters at an angle substantially perpendicular to the principal plane 100. Therefore, the incident angle of indirect incoming light on the interface 200 is, typically, larger than that of direct incoming light on the interface 200. Since the intensity reflectance at the interface 200 increases as the incident angle on the interface 200 is increased as described above, the transmittance of indirect incoming light at the interface 200 is lower than that of direct incoming light. Thus, the transmission of indirect incoming light through the interface 200 can be reduced relative to the transmission of direct incoming light.

The position of the interface 200 will now be described with reference to FIGS. 4A and 4B. When the interface 200, acting as a barrier as described above, coincides with the exit 442 of the transit portion 44, the second portion 120 of the first film 10 extends up to the exit 442 of the transit portion 44. As shown in FIG. 4B, reflected light propagates in the second portion 120 in the transit portion 44. Since the transit portion 44 is surrounded by the light-shielding film 40, light is reflected at the side wall 43 of the light-shielding film 40. It is thus difficult for the reflected light to go out of the second portion 120 in the transit portion 44 to the first portion 110 outside the transit portion 44. Consequently, most of the reflected light enters the light path portion 45 through the interface 200 as indirect incoming light. Probably, most of the light reflected in the vicinity of a pixel enters the photoelectric conversion portions 2 of that pixel and the adjacent pixel. This causes degradation of image quality.

On the other hand, the transmission of reflected light can be confined within the first film 10 by shifting the interface 200 close to the entrance 441 of the transit portion 44. More specifically, as shown in FIG. 4A, reflected light propagating from any one of the first portions 110 of the first film 10 at one side is propagated to another first portion 110 at the other side while repeating reflection at the interface 200. The reflected light is thus attenuated in the first film 10 while propagating in the first film 10. Thus, by placing the interface 200 away from the exit 442 of the transit portion 44, reflected light can be prevented from entering the light path portion 45. Consequently, most of the light reflected in the vicinity of a pixel that the light should have entered can be prevented from entering a specific photoelectric conversion portion 2, and thus, the degradation of image quality can be prevented. Although the interface 200 is configured so that indirect incoming light is not easily transmitted, as described above, part of reflected light coming to the interface 200 through the first film 10 can pass through the interface 200 to the light path portion 45 and enter the photoelectric conversion portion 2.

In the present embodiment, the interface 200 is closer to the entrance 441 than to the exit 442. It is therefore estimated that the propagation length of reflected light in the horizontal direction is increased in comparison with the case where the interface 200 coincides with the exit 442, as shown in FIG. 4B. Accordingly, the colors of images are likely to be considerably affected by the wavelength distribution of reflected light. Therefore, the wavelength distribution of reflected light that will enter the photoelectric conversion portion 2 through the light path portion 45 should not differ widely from that of direct incoming light.

When the upper surface 41 of the light-shielding film 40 is made of, for example, a material showing gold color with white light (gold-color material), light can be reflected at the upper surface 41 of the light-shielding film 40. When the upper surface 41 is made of a gold-color material, the color of the subject cannot be accurately pictured. This is probably because the reflectance of gold-color materials such as gold (Au) and copper (Cu) is significantly lower for light having short wavelengths (blue and green light) than for light having longer wavelengths (red light). For example, gold and copper have a reflectance of 95% or more for red light. The reflectance of gold is about 85% for green light, and about 40% for blue light. The reflectance of copper is about 65% for green light and about 60% for blue light. Although these reflectances are values using air as a medium, the same tendency is shown in the image sensing device 1000. Therefore, the wavelength distribution of indirect incoming light may differ from that of direct incoming light, and consequently, the color of the resulting image may appear to be different from the intrinsic color of the subject. Particularly when the image sensing device 1000 is a color image sensing device, the image taken by the device shows a tinge different from the intrinsic color of the subject, and thus this problem becomes remarkable. Also, even a monochromatic image sensing device may not produce an image showing precise contrast. On the other hand, a silver-color material exhibits a small difference among reflectances for blue light, green light and red light. For example, silver and aluminum exhibit reflectances of 80% or more for red, green and blue light. For example, tungsten exhibits reflectances of around 50% (between 40% and 60%) for red, green and blue light. Accordingly, the wavelengths of indirect incoming light rays are not easily imbalanced, and thus the image sensing device can produce images having colors accurately reflecting the color of the subject.

By bringing the interface 200 of the first film 10 and the second film 20, which have different refractive indices from each other, close to the entrance 441 of the transit portion 44, as described above, that indirect incoming light enters the light path portion 45 can be suppressed. Also, it is desirable to further reduce the possibility that part of indirect incoming light enters the light path portion 45. Accordingly, the refractive index of the first film 10 can be increased to a value higher than the refractive index of the second film 20, in addition to bringing the interface 200 close to the entrance 441 of the transit portion 44. Thus, indirect incoming light that has passed through the interface 200 can be kept away from the central axis of the light path portion 45. This is because the position (interface 200), in a direction perpendicular to the principal plane 100, of refraction of indirect incoming light is away from the exit 442 of the transit portion 44 with a distance $D_4$. For example, a case will be described with reference to FIGS. 4A and 4B, in which the refractive index of the first film 10 is higher than that of the second film 20. In the case of FIG. 4A, relative to the case of FIG. 4B, the refraction position of indirect incoming light is displaced by $D_4 \tan \theta$ in the direction parallel to the interface 200 at a level lower by a predetermined distance Z than the exit 442 of the transit portion 44. $\theta$ represents the incident angle of indirect incoming light on the interface 200. As the incident angle $\theta$ is increased, the displacement of refraction position increases. Accordingly, the light path of indirect incoming light can be kept away from the light path of direct incoming light. Since the transit portion 44 and the photoelectric conversion portion 2 are disposed so that direct incoming light can easily enter the photoelectric conversion portion 2, that indirect incoming light enters the photoelectric conversion portion can be suppressed.

In addition, by increasing the refractive index of the first film 10 to a value higher than the refractive index of the second film 20, the interface 200 can completely reflect indirect incoming light incident thereon at an incident angle higher than or equal to the critical angle. From the viewpoint of suppressing the total reflection of direct incoming light, the refractive index of the second portion 120 is preferably 1.10 to 2.00 times as high as that of the third portion 130, and more preferably 1.10 to 1.50 times. When the refractive index of the second portion 120 is 1.41 times that of the third portion 130, the critical angle is about 45 degrees.

An excessively thick first portion 110 makes it difficult to propagate reflected light to the second portion 120 from the first portion 110. In contrast, an excessively thin first portion 110 easily transmits reflected light. It is desirable that the optical length of the first portion 110 from the lower surface to the upper surface be $\lambda/2$ to $4\lambda$, preferably $\lambda$ or more. $\lambda$ represents the dominant wavelength of incident light on the light-shielding film 40. The optical length can be calculated from the thickness of the first portion 110, which is the actual length (geometric length), and the refractive index of the first portion 110.

Since the wavelength of incoming light is considered to be 760 nm or less in the present embodiment, the optical length of the first portion 110 between the upper surface and the lower surface is preferably 3040 nm or less. It is desirable that the optical length satisfies the above relationship for the wavelengths of all light rays. Accordingly, the optical length of the first portion 110 between the upper surface and the lower surface is preferably 1600 nm or less. Also, since the wavelength of incoming light is considered to be 400 nm or more in the present embodiment, the optical length of the first portion 110 between the upper surface and the lower surface is preferably 200 nm or more, and more preferably 400 nm or more. It is desirable that the optical length satisfies the above relationship for the wavelengths of all light rays. Accordingly, the optical length of the first portion 110 between the upper surface and the lower surface is preferably 360 nm or more, and more preferably 760 nm or more.

Other components or members of the image sensing device 1000 shown in FIGS. 1 and 2 will be described in detail.

When the material of the first film 10 is appropriately selected, the first film can function as a passivation film for protecting the substrate 1 and the second film 20 from moisture and chemicals, and for preventing impurities from diffusing into the substrate 1 and second film 20. When the second film 20 is made of silicon oxide, the first film 10 can be formed of at least either silicon nitride or silicon oxynitride. Materials containing nitrogen have higher refractive indices than silicon oxide, and thus can suppress the entering of indirect incoming light, as described above. A first film 10 having a thickness in the range of 100 to 1000 nm can function as a passivation film.

For the silver-color material of the upper surface 41 of the light-shielding film 40, almost all elemental metals can be used except for gold (Cu), copper (Cu) and mercury (Hg). In practice, the upper surface 41 of the light-shielding film 40 can be formed of a metal material mainly containing a metal selected from a first group consisting of aluminum (Al), titanium (Ti), vanadium (V), chromium (Cr), manganese (Mn), cobalt (Co), nickel (Ni), molybdenum (Mo), ruthenium (Ru), rhodium (Rh), palladium (Pd), silver (Ag), hafnium (Hf), tantalum (Ta), tungsten (W), iridium (Ir) and platinum (Pt). The metal material may be an elemental metal of these metals or an alloy (mixture) containing mainly (at least 50 mass %) these metals. Other compounds such as nitrides and oxides are not considered as metal materials. Of the first group, aluminum, titanium, tungsten, molybdenum, cobalt and nickel are suitable, and aluminum and tungsten are more suitable. The silver-color metal material of the upper surface 41 of the light-shielding film 40 may be a metal compound of silver color such as silicide selected from a second group consisting of titanium silicide, cobalt silicide, nickel silicide, tungsten silicide and platinum silicide.

The chief constituent of the light-shielding film 40 is typically aluminum, and may be an elemental aluminum, an Al—Cu alloy prepared by adding a very small amount of copper to aluminum, or an Al—Si alloy prepared by adding a very small amount of silicon to aluminum. These aluminum-based materials are silver-color materials. The light-shielding film 40 may be composed of a single layer, or may include a plurality of layers made of different materials. The light-shielding film 40 is typically electrically conductive. If a higher conductivity is required of the light-shielding film 40, a large part of the light-shielding film 40 may be made of a material mainly containing a gold-color material having a higher conductivity than aluminum, such as copper or gold. If a gold-color material is used as above, the light-shielding film 40 may be provided with a silver-color upper surface 41 by coating the gold material with a silver-color material, such as aluminum. The lower surface 42 and the side wall 43 of the light-shielding film 40 may be made of a material having a high reflectance for white light and showing gold color with white light. However, it is desirable that at least either the lower surface 42 or the side wall 43, preferably at least the side wall 43, be made of a material that shows silver color with white light and/or has a lower reflectance for white light. More specifically, a material having a lower reflectance for white light exhibits spectral reflectances of 75% or less, preferably 50% or less, for red, green and blue light. By reducing the reflectance of the lower surface 42 and the side wall 43, the occurrence of stray light can be reduced. For example, the side wall 43 can be made of titanium or titanium nitride. A different material or the same material can be used for the side wall 43 and the upper surface 41. In particular, when the base of the light-shielding film 40 is made of aluminum or an aluminum alloy, a titanium layer and/or a titanium nitride layer may be formed between the base and the second film 20 so that the titanium layer and/or titanium nitride layer acts as the lower surface 42 and/or the side wall 43 of the light-shielding film 40. The titanium layer and/or a titanium nitride layer acting as the lower surface 42 and/or the side wall 43, may be also provided for the base of other materials such as tungsten or cupper. The thickness of the light-shielding film 40, in practice, is preferably in the range of 100 to 1,000 nm, and more preferably 400 nm or greater. If the thickness of the light-shielding film 40 is excessively reduced, for example, to 10 nm, light cannot be sufficiently blocked, and the effect of the position of the interface to reduce the influence of reflected light is reduced.

The upper surface 41 of the light-shielding film 40 may have an unevenness even if the layer underlying the light-shielding film 40 (second film 20) is sufficiently even. For example, an aluminum film can have protrusions called hillocks depending on the process for forming the film. First, the properties (low transmittance and low absorptance for visible light) of the material of the upper surface 41 of the light-shielding film 40 are involved in reflection at the upper surface 41. Second, the shape of the upper surface 41 is involved in the reflection. Therefore, the protrusions at the upper surface 41 of the light-shielding film 40 easily cause diffuse reflection. Since diffusely reflected light is less directive, such light is preferably minimized. Accordingly, the upper surface 41 of the light-shielding film 40 is preferably specular. A specular surface can be formed by polishing the upper surface 41. In practice, when the upper surface 41 is as smooth as a specular surface formed by chemical mechanical polishing (CMP), such a surface is adequate. By forming such a specular upper surface 41, specular reflection becomes more dominant than diffuse reflection, and thus reflected light is easily controlled.

The optical length of the transit portion 44 in the optical axis direction (optical length between the entrance 441 and the exit 442) is preferably larger than or equal to the wavelength $\lambda$ of incoming light. The length L of the transit portion 44 depends on the shape of the light-shielding film 40. In the present embodiment, the geometric length of the transit portion 44 in the optical axis direction is the same as the thickness $D_3-D_2$ of the light-shielding film 40.

The third film 30 is made of an optically transparent material and is disposed over the substrate 1. In an optical sense, the third film 30 is a transparent film (third transparent film). The third film 30 can be formed of an organic material, and is typically formed of a resin.

The refractive index of the third film 30 is preferably lower than that of the first film 10. In the present embodiment, the third film 30 includes a plurality of layers. More specifically, the third film 30 as shown includes an intermediate layer 31, a color filter layer 32 and a microlens layer 33, but is not limited to this structure. The intermediate layer 31 may function to adjust the distance between the microlens layer 33 and the photoelectric conversion portion 2.

The refractive index of the third film 30 is preferably lower than that of the first film 10. More specifically, the refractive index of at least the layer in contact with the first film 10 (in the present embodiment, the intermediate layer 31) is preferably lower than that of the first film 10. When the refractive index of the third film 30 is lower than that of the first film 10, total reflection of light traveling from the first film 10 to the third film 30 occurs at the interface between the first film 10 and the third film 30. Thus, light reflected from the light-shielding film 40 to the first film 10 can be confined in the first film 10. Consequently, the possibility that the reflected light propagates in the first film 10 is increased, and accordingly, the effect can be increased which is produced by locating the interface 200 farther away from the photoelectric conversion portion 2 than the exit of the transit portion 44. If the first film 10 is excessively thick, reflected light cannot easily propagate along the light-shielding film 40, as described above. The optical length of the light-shielding film 40 from the upper surface 41 to the third film 30 is preferably $\lambda/2$ to $4\lambda$, more preferably $\lambda$ or greater, wherein $\lambda$ represents the wavelength of incoming light.

The intermediate layer 31 may be formed by coating. The upper surface of such an intermediate layer 31 can be flat, and this intermediate layer 31 can function as a planarizing layer for the color filter layer 32 formed on the intermediate layer 31. In the present embodiment, the step height between the upper surface 41 of the light-shielding film 40 and the upper surface (defining the interface 200) of the second film 20 is smaller than the thickness of the light-shielding film 40. Accordingly, a step height resulting from the thickness of the light-shielding film is hardly formed at the upper surface of the first film 10 even if the upper surface of the first film 10 is not planarized. Thus, the upper surface of the intermediate layer 31 can be formed evenly even though the intermediate layer 31 has a small thickness.

The color filter layer 32 may include monochromatic filters having different spectral characteristics for visible light in combination. The monochromatic filters are each disposed corresponding to each photoelectric conversion portion 2 so that the color filter layer 32 exhibits different spectral characteristics for visible light corresponding to each of the photoelectric conversion portions 2. Each monochromatic filter typically transmits one of the primary color lights of red, green and blue. Complementary color filters may be used. FIG. 1 shows a Bayer array including red color filters (R), green color filters (G) and blue color filters (B). By combining such a color filter layer 32 and the light-shielding film 40 having a silver-color upper surface 41, the wavelengths of reflected light can be balanced without being biased toward a specific range of wavelengths (for example, wavelengths of red light). Consequently, even if indirect incoming light enters the photoelectric conversion portion 2, the occurrence of a false color can be reduced in the resulting image.

The microlens layer 33 includes a lens base 330 and a plurality of lens portions 331. The lens base 330 extends over the pixel region. The lens portions 331 are arranged on the lens base 330. The lens base 330 and the lens portions 331 may be integrated into one body. Each lens portion 331 has a convex surface. In the present embodiment, the lens portions 331 are arranged so as to be in contact with each other, as shown in FIGS. 1 and 2. Such a microlens layer 33 is referred to as a gapless microlens layer 33. If the lens portions 331 are separate from each other, an increased amount of light enters the flat lens base 330, which does not function as a lens (does not have a light focusing function), through the gaps between the lens portions 331. Consequently, reflection can easily occur at the light-shielding film 40. When the lens portions 331 in contact with each other are disposed over the light-shielding film 40, light coming to the image sensing device 1000 is inhibited from coming incident on the light-shielding film 40 to reduce indirect incoming light. As shown in FIG. 1, however, lens portions 331 arranged in a diagonal direction of the lens portions 331 in the arrangement are separate from each other and have gaps therebetween. Thus, even though a gapless microlens layer is provided, reflection can occur at the light-shielding film 40. Therefore, the above-described structure is desirable.

The light-shielding-pixel region will now be described. The second photoelectric conversion portion 2' and the second pixel circuit portion 4' shown in FIG. 2 have substantially the same structure as, respectively, the first photoelectric conversion portion 2 and the first pixel circuit portion 4 that constitute the light-receiving pixel. The second photoelectric conversion portion 2' and the second pixel circuit portion 4' constitute a light-shielding pixel (optically black (OB) pixel). The light-shielding film 40 extends over the light-receiving-pixel region and the light-shielding-pixel region so as to cover the second photoelectric conversion portions 2' to prevent light from entering the second photoelectric conversion portions 2'. Hence, the light-shielding-pixel region does not have a transit portion 44 over the second photoelectric conversion portion 2', unlike the light-receiving-pixel region. In the light-shielding-pixel region, the first film 10 extends from the light-receiving-pixel region. The light-shielding-pixel region may further include the third film 30 including the intermediate layer 31, the color filter layer 32 and the microlens layer 33 on the first film 10. In the light-shielding pixel region, the color filter layer 32 may have monochromatic color filters of only one color (for example, only blue color filters). The portion of the light-shielding film 40 in the light-shielding-pixel region is integrated with that in the light-receiving-pixel region. In this structure, reflected light is propagated within the first film 10 from the light-shielding-pixel region through the light-receiving-pixel region. Consequently, reflected light can be suppressed from entering a specific photoelectric conversion portion 2. Thus, reflected light, particularly at the end of the light-receiving-pixel region adjacent to the light-shielding-pixel region, can be propagated to the light-shielding-pixel region and thus attenuated.

As shown in FIG. 2, in the present embodiment the second film 20 includes a plurality of layers. The second film 20 includes a first layer 21, a second layer 22 and a third layer 23. The second layer 22 lies between the first layer 21 and the substrate 1. The third layer 23 lies between the second layer 22 and the substrate 1. The first layer 21 and the second layer 22 can be formed of silicon oxide. The third layer 23 can be formed of silicon oxide, borosilicate glass (BSG), phosphosilicate glass (PSG) or borophosphosilicate glass (BPSG). Since the second film 20 functions as a transparent film, the first layer 21, the second layer 22 and the third layer 23 may be referred to as the transparent layers (first transparent layer, second transparent layer and third transparent layer, respectively).

For example, the second film 20 may be made of silicon oxide having a refractive index of about 1.5 (1.46), and the first film 10 is made of silicon oxynitride having a refractive index of about 1.7 (1.74) or silicon nitride having a refractive index of about 2.0 (2.03). Alternatively, in another example, the second film 20 may be made of silicon oxynitride having a refractive index of 1.7 and the first film 10 may be made of silicon nitride having a refractive index of 2.0.

A wiring structure 70 is disposed between the light-shielding film 40 and the substrate 1. In the present example, the wiring structure 70 is a multilayer type and includes a first wiring pattern 71 and a second wiring pattern 72. The wiring structure 70 further includes first plugs 74 connecting the wiring portions of the first wiring pattern 71 and the corresponding control electrodes 3, second plugs 75 connecting the wiring portions of the first wiring pattern 71 and the corresponding wiring portions of the second wiring pattern 72, and third plugs 76 connecting the wiring portions of the second wiring pattern 72 and the corresponding portions of the light-shielding film 40. The first wiring pattern 71 is disposed between the third layer 23 and the second layer 22, and the second wiring pattern 72 is disposed between the second layer 22 and the first layer 21. Although the wiring structure 70 in the pixel region, in the present embodiment, has two levels of the first wiring pattern 71 and the second wiring pattern 72, the wiring structure 70 may have three or more levels. The second film 20 may be used as an interlayer insulating layer. Therefore, in terms of the electrical characteristics, the second film 20 may be referred to as an insulating film (second insulating film). The first layer 21, the second layer 22 and the third layer 23 of the second film 20 functioning as an insulating film may be referred to as the insulating layers (first insulating layer, second insulating layer and third insulating layer, respectively). The upper surfaces of the wiring patterns between the light-shielding film 40 and the substrate 1 need not be polished as smoothly as the upper surface 41 of the light-shielding film 40. When the upper surface of the first wiring pattern 71 and the second wiring pattern 72 are specular, light reflected at the upper surface of the first wiring pattern 71 or the upper surface of the second wiring pattern 72 become likely to be reflected again at the lower surface of the second wiring pattern 72 or the lower surface 42 of the light-shielding film 40, and thus stray light is likely to be produced. Aluminum wiring patterns can be easily formed by a method other than a Damascene process accompanied by polishing wiring patterns, and thus using aluminum is advantageous. The wiring patterns may also be formed of mainly copper. In this instance, the second film 20 may include a silicon nitride layer or other layers for preventing the diffusion of copper.

Although the electrically conductive light-shielding film 40 may not be connected to any fixed or controlled voltage node, or the potential of the light-shielding film 40 may be varied with time, the potential is preferably controlled to be constant. In the embodiment shown in FIG. 2, the light-shielding film 40 is connected to some wiring portions of the second wiring pattern 72, which defines the supply potential, through the third plugs 76. Since the light-shielding film 40 need not have so fine a pattern as the wiring patterns and plugs, the resistance of the light-shielding film 40 can be more easily reduced than the wiring patterns and plugs. Therefore, voltage drop can be reduced by applying a potential at one time to the entirety of the pixel region, using the light-shielding film 40. Consequently, the pixel circuit portions 4 can be uniformly operated, and thus satisfactory even images can be formed.

Each pixel circuit portion 4 of the pixels may include a transfer gate, a floating diffusion portion, an amplification transistor, a reset transistor, and a selection transistor. In FIG. 2, the gate electrodes of the transfer gates are shown as the control electrodes 3. The control electrode 3 is typically made of polysilicon. The pixel circuit portion 4 may not be provided for each pixel, but may be provided for every two pixels in a pixel-common structure. By forming the light-shielding film 40 so as to cover the pixel circuit portions 4, light can be inhibited from entering the pixel circuit portions 4 and causing noise.

The peripheral circuitry portion 5 may include a signal input circuit to which external signals are input, a timing generation circuit, a scanning circuit and a signal processing circuit. The electrode pad 80 is electrically connected to the peripheral circuit portion 5 with the wiring structure 70. More specifically, the lower surface 82 of the electrode pad 80 is joined to the corresponding third plug 76 of the wiring structure 70. The peripheral circuit portion 5 generates a signal according to the signal charge obtained at the photoelectric conversion portion 2 and outputs the signal from the electrode pad 80. A supply voltage from an external power source and external signals are input to other electrode pads 80. Bonding wires are connected to the upper surfaces of the electrode pads 80 and signals are input and/or output through the bonding wires.

The chief constituent of the electrode pad 80 is preferably the same as that of the light-shielding film 40, and both are mainly made of aluminum. A coating (not shown) may be formed over the upper surface 81 of the electrode pad 80 to enhance the chemical stability or to enhance the adhesion with bonding wires. The coating can be formed of, for example, titanium nitride. The upper surface 81 of the electrode pad 80 may be formed of a gold-color material or may be plated with gold or titanium nitride, and thus has gold color. The peripheral circuit portion 5 and the wiring structure 70 connected to the peripheral circuit portion 5 are located between the electrode pads 80 and the pixel region. Reflected light from the electrode pads 80 is unlikely to enter the second photoelectric conversion portions 2' in the pixel region. The first film 10 overlaps with the upper surfaces 81 of the electrode pads 80 at their outer areas, so that the moisture can be prevented from penetrating the electrode pads 80 through their edges.

The light-shielding film 40 and the electrode pads 80 can be disposed in the same plane parallel to the principal plane 100 of the image sensing device, as shown in FIG. 2. In other words, the light-shielding film 40 and the electrode pads 80 can be disposed at the same level. More specifically, the distance between the lower surface 82 of the electrode pad 80 and the principal plane 100 is shorter than or equal to the distance (substantially equal to distance $D_1$) between the upper surface 41 of the light-shielding film 40 and the principal plane 100. Also, the distance between the upper surface 81 of the electrode pad 80 and the principal plane 100 is longer than or equal to the distance (substantially equal to distance $D_2$) between the lower surface 42 of the light-shielding film 40 and the principal plane 100. In the embodiment shown in FIG. 2, the distance between the lower surface 82 of the electrode pad 80 and the principal plane 100 is equal to the distance between the lower surface 42 of the light-shielding film 40 and the principal plane 100. Also, the distance between the upper surface 81 of the electrode pad 80 and the principal plane 100 is equal to the distance between the upper surface 41 of the light-shielding film 40 and the principal plane 100.

Although the pixel region may have wiring patterns at two levels (first wiring pattern 71 and second wiring pattern 72) in the wiring structure 70, the peripheral circuit region may have wiring patterns at a larger number of levels in the wiring structure 70, as shown in FIG. 2. In the embodiment shown in FIG. 2, the peripheral circuit region has wiring patterns at three levels (first wiring pattern 71, second wiring pattern 72 and third wiring pattern 73). In the pixel region, the number of levels of the wiring patterns is reduced for a low profile structure, so that the sensitivity of the photoelectric conversion portions 2 can be increased. In contrast, in the peripheral circuit region, the number of wiring patterns is increased for a fine-structure, high-performance peripheral circuit portions 5.

The electrode pads 80 and the third wiring pattern 73 can be disposed in the same plane parallel to the principal plane 100, as shown in FIG. 2. In other words, the electrode pads 80 and the third wiring pattern 73 can be disposed at the same level. When the electrode pads 80 and the light-shielding film 40 lie at the same level, as described above, the third wiring pattern 73 also lies at the same level as the light-shielding film 40.

In the present embodiment, the third wiring pattern 73 has a plurality (three in the depicted embodiment) of wiring portions, and the wiring portions are separated from each other by the second film 20. Also, the second film 20 separates the third wiring pattern 73 from the electrode pads 80. Similarly, the second film 20 separates the third wiring pattern 73 from the light-shielding film 40. Hence, the electrode pads 80 and the light-shielding film 40 are separated by the second film 20, and more specifically, the first layer 21 of the second film 20 is disposed between the electrode pads 80 and the light-shielding film 40. The second film 20 (disposed between each of the wiring portions, wiring pads 80 and light-shielding film 40) preferably has a lower dielectric constant than the first film 10. If a material having a high dielectric constant (for example, first film 10) is disposed between the electrode pads 80 and the third wiring pattern 73, the electrostatic capacitance between each of the third wiring pattern 73, electrode pads 80 and light-shielding film 40 is increased. Accordingly, a material having a lower dielectric constant (second film 20) is provided to reduce the electrostatic capacitance between each of the third wiring pattern 73, electrode pads 80 and light-shielding film 40. Typically, the wiring portions of the third wiring pattern 73, the electrode pads 80 and the light-shielding film 40 each have a different potential, and the potentials of the electrode pads 80 and the wiring pattern 73 are varied with time. By reducing the electrostatic capacitance between these wiring portions and pads, signals can be transmitted without delay, and thus satisfactory images can be formed.

The first film 10 extends from the pixel region to the peripheral circuit region so as to cover the third wiring pattern 73 and overlap the outer areas of the electrode pads 80. Also, at least part of the third film 30 (in the present embodiment, the intermediate layer 31 and the color filter layer 32) extends from the pixel region to the peripheral circuit region so as to cover the first film 10. In the present embodiment, a large part of the peripheral circuit region is covered with a blue color filter (B). Light rays having long wavelengths (for example red and green light rays) of light that have entered the peripheral circuit region more easily reach the peripheral circuit portion 5 than light rays having shorter wavelengths. It is therefore desirable that the peripheral circuit region be provided with the blue color filter that can absorb light having long wavelengths. Thus, light coming into the peripheral circuit portion 5 without being blocked by the third wiring pattern 73 or the electrode pads 80 is reduced in the peripheral circuit region, and thus noise can be reduced in the peripheral circuit portion 5. The first film 10 and the third film 30 have apertures in the portions overlying the electrode pads 80, and thus the electrode pads 80 are exposed in the apertures.

Second Embodiment

A second embodiment will now be described. The second embodiment takes some forms in which details of the first embodiment are modified. Detailed descriptions of parts similar to those described above with respect to the first embodiment will be omitted.

Figure 5A:
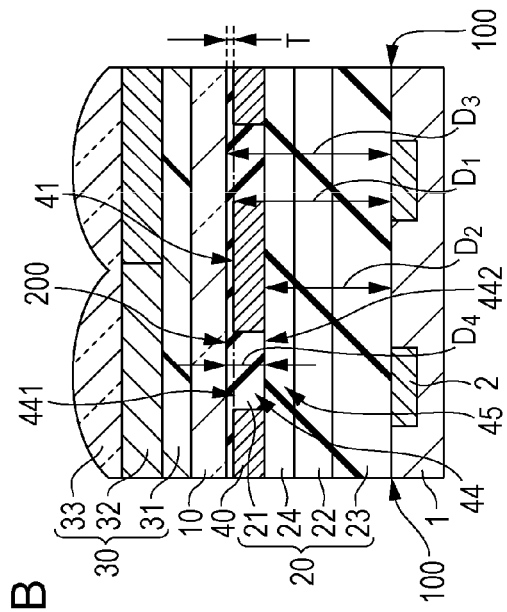
FIG. 5A is a schematic sectional view of a first configuration according to a second embodiment of the invention.

The second embodiment may take a first configuration shown in FIG. 5A. The first configuration is different in the shape of the first film 10 from the first embodiment shown in FIGS. 2 and 3. In the first configuration, shallow recesses are formed in the first film 10, reflecting the difference in level between the upper surface 41 of the light-shielding film 40 and the upper surface of the second film 20.

When deep recesses are formed in the first film 10 depending on the deposition process of the first film 10, such an uneven first film 10 is better to be planarized by chemical mechanical planarization/polishing (CMP) or an etch back process. However, the surface on which the first film 10 will be formed can be flattened by bringing the interface 200 as close to the entrance 441 of the transit portion 44 as possible, as shown in FIG. 2. Consequently, a first film 10 having a shallow recess or a flat upper surface can be formed without being planarized.

In a first configuration, the second film 20 includes a first layer 21, a second layer 22, a third layer 23 and a fourth layer 24. The first film 10 preferably has a higher refractive index than the first layer 21 of the second film 20. For example, when the first film 10 is made of silicon nitride, the first layer 21 can be formed of silicon oxide. In this instance, the fourth layer 24 is also formed of silicon oxide. The fourth layer 24 may be referred to as a fourth transparent layer or a fourth insulating layer.

Figure 5B:
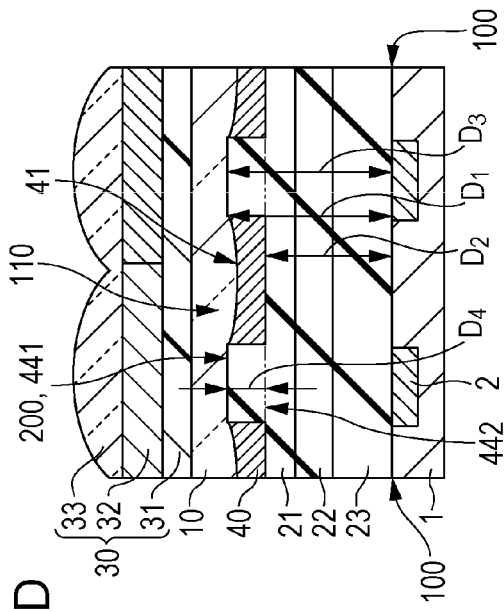
FIG. 5B is a schematic sectional view of a second configuration according to the second embodiment.

A second configuration of the second embodiment will be described with reference to FIG. 5B. In the second configuration, the interface 200 between the first film 10 and the second film 20 lies at a different position from the first embodiment.

The second configuration is different from the first configuration in that part of the first layer 21 of the second film 20 lies within the transit portion 44, and the rest of the first layer 21 lies on one side of the transit portion 44 opposite the photoelectric conversion portion 2 (above the transit portion 44). In addition, the first layer 21 spreads thinly over the light-shielding film and is in contact with the upper surface 41 of the light-shielding film 40. Consequently, the first film 10 is not in contact with the upper surface 41 of the light-shielding film 40, and is spaced from the upper surface 41 by the thickness T of the thinly spread portion. In this configuration, the thinly spread portion and the portions disposed within the transit portions 44 are formed in a single layer (first layer 21). These portions may alternatively be formed in different layers. When the optical length $D_O$ between the light-shielding film 40 and the first film 10 is smaller than or equal to the wavelength λ of incoming light, the first film 10 and the upper surface 41 of the light-shielding film 40 can be considered to be closely adjacent to each other. The optical length $D_O$ has been described in the first embodiment.

Figure 5C:
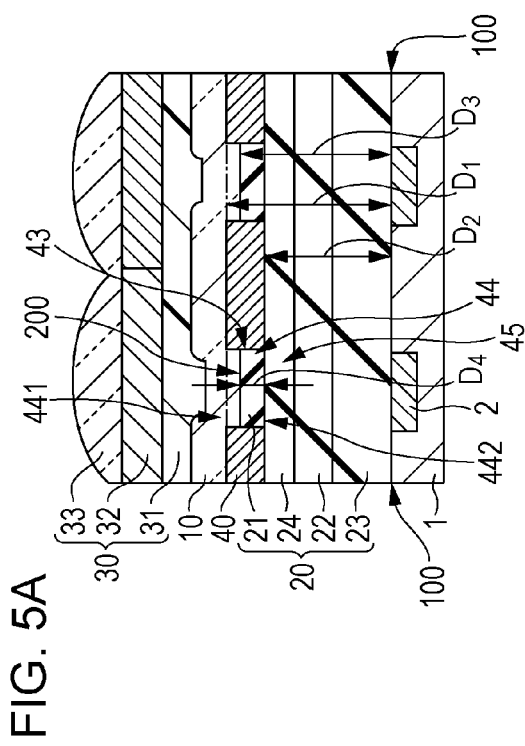
FIG. 5C is a schematic sectional view of a third configuration according to the second embodiment.

A third configuration of the second embodiment will be described with reference to FIG. 5C. In the third configuration, the shape of the interface 200 is different from that in the first embodiment.

The interface 200 is convex downward in the third configuration. More specifically, the first film 10 has a convex lower surface, and the second film 20 (first layer 21) has a concave upper surface. When the second film 20 has a higher refractive index than the first film 10 and the interface 200 is convex downward, the interface 200 can condense light.

Unlike the first configuration, the first film 10 of the third configuration is not in contact with the side walls 43 of the light-shielding film 40. Consequently, the influence of noise resulting from reflected light can be reduced more effectively in the third configuration than in the first configuration.

Figure 5D:
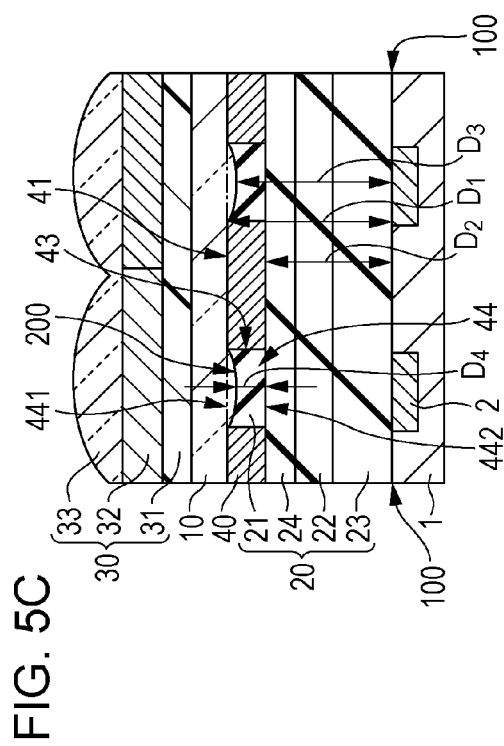
FIG. 5D is a schematic sectional view of a fourth configuration according to the second embodiment.

A fourth configuration of the second embodiment will be described with reference to FIG. 5D. In the fourth configuration, the shape of the light-shielding film 40 is different from that in the first embodiment. In this form, the upper surface 41 of the light-shielding film 40 has concave portions. Such an upper surface 41 can inhibit incident light on the upper surface 41 from reflecting to the second portion 120. In particular, when the upper surface 41 of the light-shielding film 40 has specular concave portions, the light-shielding film 40 acts like a concave surface and condenses light, thus inhibiting the reflected light from propagating to the second portion 120. Unlike the second configuration, the second portion 120 in the fourth configuration is not in contact with the upper surface 41 of the light-shielding film 40. Consequently, the influence of noise can be reduced more effectively in the fourth configuration than in the second configuration.

Third Embodiment

A third embodiment of the invention will now be described. The third embodiment can be applied to the first and second embodiments. The third embodiment provides a structure that allows direct incoming light to enter the photoelectric conversion portion 2 more easily than that of the first and second embodiments. The third embodiment can take several configurations, and four exemplary configurations (first to fourth configurations) will be described below. These can be combined with each other.

Figure 6A:
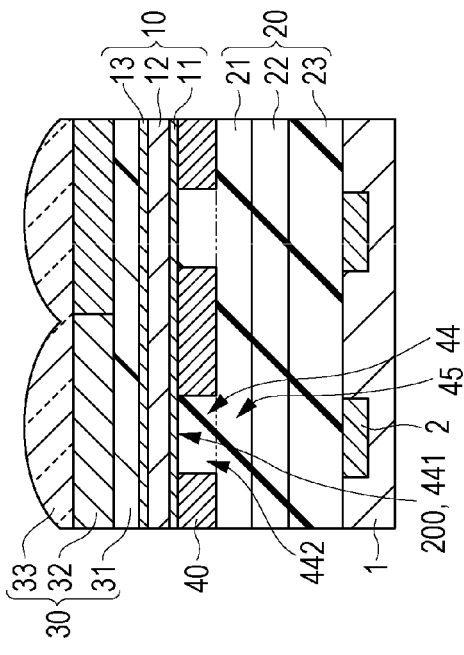
FIG. 6A is a schematic sectional view of a first configuration according to a third embodiment of the invention.

A first configuration of the third embodiment will be described with reference to FIG. 6A. The first configuration is different from the first embodiment in that the first layer 21 of the second film 20 within the transit portion 44 has a different refractive index from the first to fourth layers 22 to 24 of the second film 20 constituting the light path portion 45. The first configuration is similar to the structure of the first embodiment shown in FIG. 2 in that the first film 10 has a different refractive index from the second film 20.

In this configuration, the second film 20 includes a first layer 21, a second layer 22, a third layer 23 and a fourth layer 24. The fourth layer 24 lies between the first layer 21 and the second layer 22. The first layer 21 and the fourth layer 24 have different refractive indices.

The entirety of the first layer 21 lies within the transit portions 44. Part of the second layer 22 and third layer 23 lie in the light path portions 45.

The first layer 21 has a refractive index between those of the first film 10 and the fourth layer 24. When the first film 10 is made of silicon nitride having a refractive index of 2.0 and the first layer 21 is made of silicon oxide having a refractive index of 1.5, the difference in refractive index between these two layers is 0.5. The reflectance of incident light on the interface 200 between media having different refractive indices is expressed by Equation 2.

$$R=(N_1-N_2)^2/(N_1+N_2)^2 \quad \text{(Equation 2)}$$

In Equation 2, $N_1$ represents the refractive index of the medium (first film 10) on the light-incoming side of the interface 200, and $N_2$ represents the refractive index of the medium (second film 20) on the light-emitting side of the interface 200.

In this configuration, the difference in refractive index between the first film 10 and the first layer 21 of the second film 20 and the difference in refractive index between the first layer 21 and the fourth layer 24 are each smaller than the difference in refractive index between the first film 10 and the fourth layer 24 of the second film 20. Thus, the transmittance of direct incoming light from the first film 10 to the fourth film 24 is increased. When, for example, the first film 20 is made of silicon nitride having a refractive index of 2.0 and the fourth layer 24 is made of silicon oxide having a refractive index of 1.5, the first layer 21 can be formed of silicon oxynitride having a refractive index of 1.7.

A second configuration of the third embodiment will be described with reference to FIG. 6B.

The second configuration is different from the first embodiment in that the first film 10 includes a plurality of layers. The first film 10 has a three-layer structure including a first intermediate-refractive-index layer 11, a different-refractive-index layer 12, and a second intermediate-refractive-index layer 13. Alternatively, the first film 10 may have a double-layer structure in which the first intermediate-refractive-index layer 11 or the second intermediate-refractive-index layer 13 is omitted.

The different-refractive-index layer 12 lies between the first intermediate-refractive-index layer 11 and the second intermediate-refractive-index layer 13. The first intermediate-refractive-index layer 11 is disposed between the second film 20 (first layer 21) and the different-refractive-index layer 12 and in contact with the first layer 21 and the different-refractive-index layer 12. The first intermediate refractive index layer 11 has a refractive index between the refractive indices of the different-refractive-index layer 12 and the second film 20. The second intermediate-refractive-index layer 13 is disposed between the third film 30 (intermediate layer 31) and the different-refractive-index layer 12 and in contact with the intermediate layer 31 and the different-refractive-index layer 12. The second intermediate-refractive-index layer 13 has a refractive index between the refractive indices of the different-refractive-index layer 12 and the third film 30.

The presence of the first intermediate-refractive-index layer 11 can increase the transmittance of direct incoming light from the first film 10 to the second film 20 because of the same reason as in the first configuration of the present embodiment. Similarly, the presence of the second-intermediate-refractive index layer 13 can increase the transmittance of direct incoming light from the third film 30 to the first film 10 because of the same reason as in the second embodiment.

The thickness $T_{11}$ of the first intermediate-refractive-index layer 11 is preferably between $(M-0.5)\lambda/4N_{11}$ and $(M+0.5)/4N_{11}$, and may be, for example, $M\lambda/4N_{11}$. M represents an odd number, and $N_{11}$ represents the refractive index of the first intermediate-refractive-index layer 11. M is preferably 1 or 3, and more preferably 1. The first intermediate-refractive-index layer 11 having such a thickness has the function of suppressing reflection in a sense of wave optics. More specifically, in the first intermediate-refractive-index layer 11, light reflected from the interface 200 between the second film 20 and the intermediate refractive index layer 11 interferes with light reflected from the interface between the first intermediate-refractive-index layer 11 and the different-refractive-index layer 12, and these reflected lights are thus weakened by each other. Also, the thickness $T_{13}$ of the second intermediate-refractive-index layer 13 is preferably between $(M-0.5)\lambda/4N_{13}$ and $(M+0.5)\lambda/4N_{13}$, and may be, for example, $M\lambda/4N_{13}$. M represents an odd number, and $N_{13}$ represents the refractive index of the second intermediate-refractive-index layer 13.

The thickness of the different-refractive-index layer 12 is represented by $T_{12}$, and its refractive index is represented by $N_{12}$. The thickness $T_1$ of the first film 10 having a three-layer structure is expressed by $T_{11}+T_{12}+T_{13}$. The thickness $T_1$ of the first film 10 preferably satisfies the relationship $\lambda/2 \leq N_{11}T_{11}+N_{12}T_{12}+N_{13}T_{13} \leq 4\lambda$. In general, the thickness of each layer of the first film 10 including m layers (m≥1) in which the k-th layer has a refractive index $N_{1k}$, and to thickness $T_{1k}$ satisfies the following Equation 3. When the first film 10 is composed of a single layer, m=1 and $\lambda/2N_1 \leq T_1 \leq 4\lambda/N_1$ hold true.

$$\frac{\lambda}{2} \leq \sum_{k=1}^{m} N_{1k}T_{1k} \leq 4\lambda \quad \text{(Equation 3)}$$

The refractive index of the different-refractive-index layer 12 may be lower than that of one or both of the first intermediate-refractive-index layer 11 and the second intermediate-refractive-index layer 13, but it is preferably higher than that of the second intermediate-refractive-index layer. When the refractive index of the different-refractive-index layer 12 is higher than that of the second intermediate-refractive-index layer 13, the interface between the second intermediate-refractive-index layer 13 and the different-refractive-index layer 12 refracts light in a direction toward the center of the transit portion 44 according to Snell's law. Accordingly, the amount of light coming incident on the upper surface 41 of the light-shielding film 40 can be reduced, and direct incoming light is increased. The different-refractive-index layer 12 preferably has a higher refractive index than both the first and second intermediate-refractive-index layers 11 and 13. When the refractive index of the different-refractive-index layer 12 is higher than those of the first and second intermediate-refractive-index layers 11 and 13, the first intermediate-refractive-index layer 11 exhibits a higher refractive index than the second film 20. In this instance, the refractive index of the first film 10 is higher than those of the first film 20 and the third film 30.

For example, when the second film 20 is made of silicon oxide having a refractive index of 1.5, the different-refractive-index film 12 may be formed of silicon nitride having a refractive index of 2.0, and the first intermediate-refractive-index layer 11 may be formed of silicon oxynitride having a refractive index of 1.7. Similarly, when the third film 30 is made of a resin having a refractive index of 1.6, the different-refractive-index film 12 may be formed of silicon nitride having a refractive index of 2.0, and the second intermediate-refractive-index layer 13 may be formed of silicon oxynitride having a refractive index of 1.7. For incoming light having a wavelength of 550 nm, the first and second intermediate-refractive-index layers 11 and 13 each can be formed to a thickness of 80 nm. The thickness of the different-refractive-index layer 12 can be about 400 nm. In this instance, the optical length between the upper surface and the lower surface of the first film 10 is about 1072 nm, about twice the wavelength (550 nm) of incoming light.

A third configuration of the third embodiment will be described with reference to FIG. 6C.

This configuration is different from the first embodiment in that the image sensing device includes an in-layer lens. The in-layer lens lies between the microlens layer 33 and the light-shielding film 40. Also, the in-layer lens lies preferably between the color filter layer 32 and the light-shielding film 40. Although the in-layer lens may be provided independently of the first film 10, the first film 10 may have a convex lens shape to act as the in-layer lens. In the third configuration, the upper surface of the first film 10 has a convex lens shape to act as the in-layer lens. Silicon nitride, which is suitable for the first film 10, is also suitable as the material of the in-layer lens. The in-layer lens may have a multilayer structure as in the second configuration of the third embodiment.

A fourth configuration of the third embodiment will be described with reference to FIG. 6D.

This configuration is different from the first embodiment in that an optical waveguide structure is provided. The second film 20 includes a first layer 21, a second layer 22, a third layer 23, a fourth layer 24, a fifth layer 25 and a sixth layer 26.

The fifth layer 25 lies between the fourth layer 24 and the second layer 22, and the sixth layer 26 lies between the second layer 22 and the third layer 23.

The refractive index of the first layer 21 is higher than those of the second, third and fourth layers 22, 23 and 24. The refractive index of the fifth layer 25 is higher than those of the fourth layer 24 and the second layer 22, and the refractive index of the sixth layer 26 is higher than those of the second layer 22 and the third layer 23.

The first layer 21 is surrounded by the second layer 22, the third layer 23 and the fourth layer 24. The first layer 21 is also surrounded by the fifth layer 25 and the sixth layer 26. The first layer 21 passes through the second layer 22, the fourth layer 24, the fifth layer 25 and the sixth layer 26.

Thus, the second film 20 has an optical waveguide structure in which the first layer 21 acts as the core and the second to fourth layers 22 to 24 act as the cladding. Consequently, light emitted from the transit portion 44 can be prevented from deviating (leaking) from the light path portion 45, and thus the light-use efficiency can be increased. When the refractive index of the first layer 21 is lower than those of the fifth layer 25 and the sixth layer 26, the fifth and sixth layers 25 and 26 do not form core-cladding structures with the first layer 21. However, the second film 20 can sufficiently act as an optical waveguide in practice, as long as the thicknesses of the fifth and sixth layers 25 and 26 are much smaller than those of the fourth layer 24, the second layer 22 and the third layer 23.

For example, when the second layer 22, the third layer 23 and the fourth layer 24 are made of silicon oxide having a refractive index of 1.5, the first layer 21 can be formed of silicon oxynitride having a refractive index of 1.7 or a resin in which high refractive index particles are dispersed.

For example, when first film 10 is made of silicon oxide, the first layer 21 of the second film 20 may be formed of silicon nitride having a refractive index of 2.0 although the refractive index of the first film 10 becomes lower than that of the second film 20 (first layer 21).

The fifth layer 25 and the sixth layer 26 can be formed of silicon nitride having a refractive index of 2.0. When the first wiring pattern 71 and the second wiring pattern 72 are mainly made of copper, the silicon nitride fifth and sixth layers 25 and 26 can prevent the diffusion of copper. From the viewpoint of reducing the leakage of light from the first layer 21 acting as a core to the fifth and sixth layers 25 and 26, the difference in refractive index is preferably small between the first layer 21 and the fifth layer 25 and between the first layer 21 and the sixth layer 26.

Fourth Embodiment

Figure 7A:
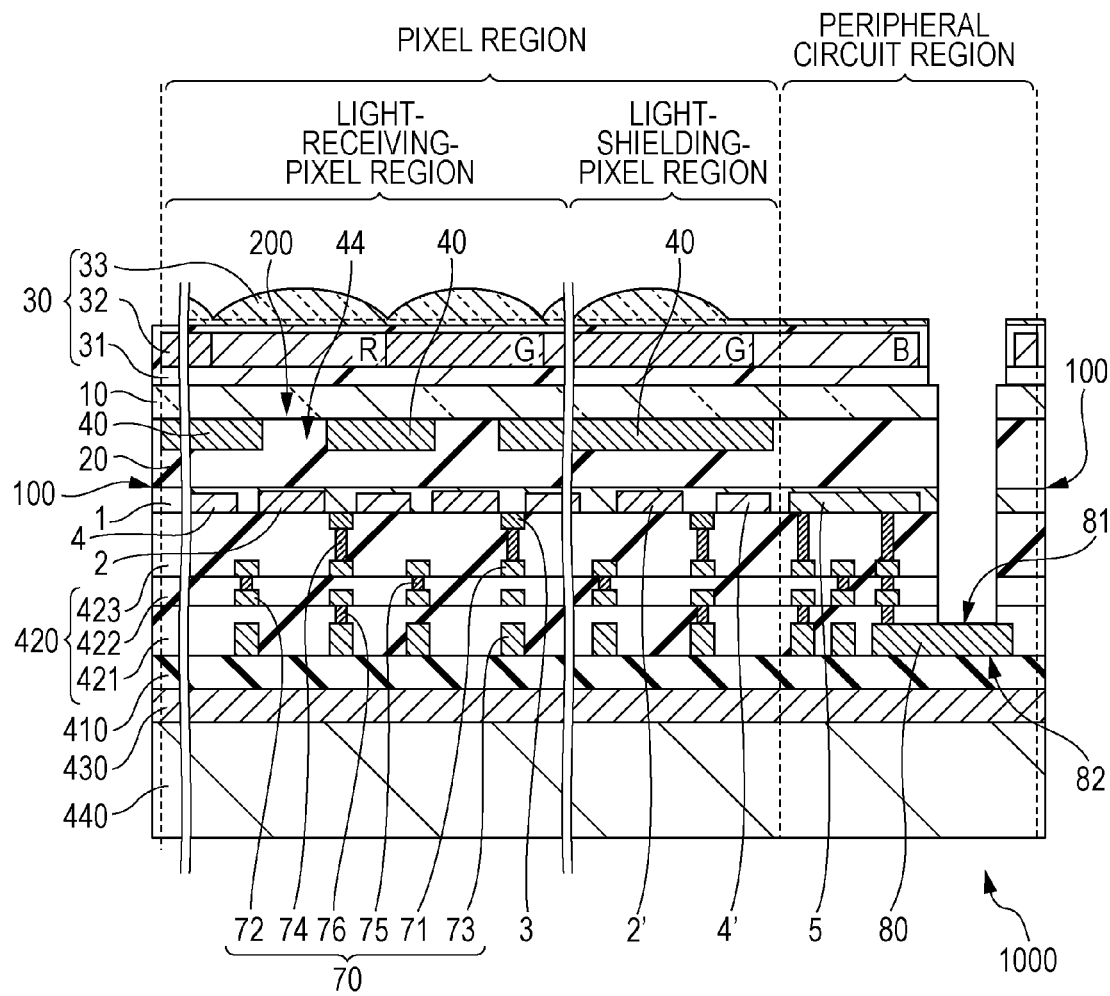
FIG. 7A is a schematic sectional view of a fourth embodiment of the invention.

A fourth embodiment will be described with reference to FIG. 7A.

While the first to third embodiments are applied to front-side illumination CMOS image sensors, the present embodiment will be applied to a backside illumination CMOS image sensor.

The substrate 1 includes a plurality of photoelectric conversion portions 2. The light-receiving surfaces, that is, the principal plane 100 of the image sensing device, coincide with the rear surface of the substrate 1. The photoelectric conversion portions 2, pixel circuit portions 4 and peripheral circuit portions 5 are formed by doping a semiconductor region by, for example, ion implantation from the front side of the substrate 1. Then, the substrate 1 is ground to a thickness of about 1 to 10 μm from the backside. Thus, the backside is used as the light-receiving surfaces of the photoelectric conversion portions 2. The differences from the first to third embodiments will be mainly described below.

The first film 10, the second film 20, the third film 30 and the light-shielding film 40 are formed at the principal plane side (light-incoming side) of the substrate 1.

The light-shielding film 40 mainly containing a silver-color material, such as aluminum or tungsten, is disposed over the principal plane 100 and defines transit portions 44 through which light enters pixels arranged adjacent to each other. In other words, the light-shielding film 40 is a latticed film having a plurality of apertures (corresponding to the transit portions 44). The upper surface 41 of the light-shielding film 40 is made of a silver-color material. The lower surface 42 of the light-shielding film 40 may be made of a gold-color material, such as titanium nitride.

A second film 20 made of silicon oxide or the like is disposed between the light-shielding film 40 and the substrate 1. An antireflection film (not shown) may be formed between the second film 20 and the substrate 1. The antireflection film has a refractive index between those of the second film 20 and the substrate 1. For example, when the second film 20 is made of silicon oxide and the substrate 1 is made of silicon, the antireflection film is formed of, for example, silicon nitride, silicon oxide, titanium oxide, or hafnium oxide. Part of the second film 20 lies within the apertures, for example transit portions 44.

The first film 10 covers the light-shielding film 40, and defines interfaces 200 with the second film 20 near the transit portions 44. As described in the first and second embodiments, each interface 200 is more distant from the corresponding photoelectric conversion portion 2 than the exit 442 of the corresponding transit portion 44. The interface 200 is preferably as close to the entrance 441 of the transit portion 44 as possible. The interface 200 and the upper surface 41 of the light-shielding film 40 preferably lies in the same plane parallel to the principal plane 100.

The refractive index of the first film 10 is different from that of the second film 20, and is preferably higher than that of the second film 20. When the first film 10 is made of silicon oxide, the second film 20 can be formed of silicon nitride or silicon oxynitride. The above are the same as in the first embodiment, and have been described with respect to the structure of the principal plane 100 side. The opposite side to the principal plane 100 of the substrate 1 will now be described. In the fourth embodiment, unlike the first embodiment, the wiring structure 70 is disposed on the opposite side of the substrate 1 to the principal plane, but not between the light-shielding film 40 and the substrate 1. Other parts or members are similar to those in the first embodiment, and will not be described again in detail.

The wiring structure 70 includes three layers of a first wiring pattern 71, a second wiring pattern 72 and a third wiring pattern 73. The wiring structure 70 also includes first plugs 74, second plugs 75 and third plugs 76. On the opposite side from the principal plane 100, a protective insulating film 410 and an interlayer insulating film 420 are disposed. The interlayer insulating film 420 is disposed between the protective insulating film 410 and the substrate 1. The protective insulating film 410 and the interlayer insulating film 420 each extend from the pixel region to the peripheral circuit region.

The interlayer insulating film 420 includes a first insulating layer 421, a second insulating layer 422 and a third insulating layer 423. The first wiring pattern 71 is disposed between the third insulating layer 423 and the second insulating layer 422, and the second wiring pattern 72 is disposed between the third insulating layer 423 and the first insulating layer 421.

Although the first wiring pattern 71 and the second wiring pattern 72 may mainly contain copper, aluminum may also be substituted. Although the third wiring pattern 73 may mainly contain aluminum, copper is also suitable. The third wiring pattern 73 is embedded in the first insulating layer 421 of the interlayer insulating film 420. Thus, the third wiring pattern 73 and the interlayer insulating film 420 (first insulating layer 421) lie in the same plane parallel to the principal plane 100. As shown in FIG. 7A, the wiring patterns can be provided for both the pixel region and the peripheral circuit region. Alternatively, any of the wiring patterns may be provided only for either the pixel region or the peripheral circuit region. For example, the third wiring pattern 73 may be provided only for the peripheral circuit region.

Electrode pads 80 are disposed in the peripheral circuit region. The electrode pads 80 are embedded in the first insulating layer 421 of the interlayer insulating film 420 as well. Thus, the electrode pads 80 and the interlayer insulating film 420 (first insulating layer 421) lie in the same plane parallel to the principal plane 100. The electrode pads 80 may mainly contain aluminum.

The electrode pads 80 and the third wiring pattern 76 lie in the same plane parallel to the principal plane 100. Hence, the electrode pads 80, the third wiring pattern 73 and the interlayer insulating film 420 (in the present embodiment, first insulating layer 421) lie in the same plane parallel to the principal plane 100. Consequently, the electrode pads 80 and the third wiring pattern 73 are separated from each other by the interlayer insulating film 420 (in the present embodiment, first insulating layer 421) in the peripheral circuit region. The upper surface 81 of the electrode pad 80 is exposed to the light-incoming side so as to be connected with an external terminal.

The protective insulating film 410 is in contact with the interlayer insulating film 420, the third wiring pattern 76 and the electrode pads 80. More specifically, the protective insulating film 410 is in contact with the lower surfaces 82 of the electrode pads 80 and the lower surface of the third wiring pattern 73. The protective insulating film 410 is in contact with the portion (lower surface of the first layer 421) of the interlayer insulating film 420 lying between each of the third wiring pattern 76 and electrode pads 80. By arranging the protective insulating film 410 in this manner, the electrode pad 80, which is easily stressed, can be prevented from separating from the interlayer insulating film 420. The other layers of the interlayer insulating film 420 can be designed so as to have the same dielectric constant and other properties as in other embodiments.

The interlayer insulating film 420 lying between the wiring portions of the third wiring pattern 73 and between the third wiring pattern 73 and the electrode pads 80 preferably has a lower dielectric constant than the protective insulating film 410. For example, the interlayer insulating film 420 is made of silicon oxide having a dielectric constant of about 4, whereas the protective insulating film 410 is made of silicon nitride having a dielectric constant of about 7.

If a material having a high dielectric constant (for example, protective insulating film 410) is disposed between the electrode pads 80 and the third wiring pattern 73, the electrostatic capacitance between the third wiring pattern 73 and the electrode pads 80 is increased. In contrast, if a material having a low dielectric constant (for example, interlayer insulating layer 420) is disposed between the third wiring pattern 73 and the electrode pads 80, the electrostatic capacitance between the third wiring pattern 73 and the electrode pads 80 is reduced.

Typically, the wiring portions of the third wiring pattern 73 and the electrode pads 80 each have a different potential, and the potentials of the electrode pads 80 and the wiring pattern 73 are varied with time. By reducing the electrostatic capacitance between these wiring portions and pads, signals can be transmitted without delay, and thus satisfactory images can be formed.

In the present embodiment, the image sensing device 1000 includes a support substrate 440 that supports the thin substrate 1 to enhance the rigidity. An adhesive film 430 is disposed between the support substrates 440 and the substrate 1.

Although, in the above embodiments, the wiring pads 80 are disposed at the same level as the third wiring pattern 73, which is the most distant from the substrate 1 of the wiring patterns of the wiring structure 70, the position of the wiring pads 80 is not limited to such an arrangement. For example, the first wiring pattern 71 and the electrode pads 80 may be disposed at the same level.

Although, in the above embodiments, the upper surface 81 of the electrode pad 80 is exposed so that an external terminal can be connected to the upper surface 81 of the electrode pad 80, the external terminal may be connected to the lower surface 82 of the electrode pad 80. For example, an aperture may be formed in the portion of the protective insulating film 410 corresponding to the electrode pad 80, and flip-chip bonding may be performed so that an external terminal, such as a bump, is connected to the lower surface 82 of the electrode pad 80.

As described with reference to FIGS. 1 and 2 in the first embodiment, and with reference to FIG. 7A in the fourth embodiment, the image sensing device 1000 has a pixel region in which a plurality of photoelectric conversion portions 2 are arranged, and a peripheral circuit region. The image sensing device 1000 includes a fourth film extending from the pixel region and the peripheral circuit region, and a fifth film extending from the pixel region to the peripheral circuit region. The image sensing device 1000 further includes a wiring pattern 73 and an electrode pad 80 in the peripheral circuit region. The fifth film, the electrode pad 80, and the wiring pattern 73 lie in the same plane parallel to the plane including the light-receiving surfaces of the photoelectric conversion portions 2, and are in contact with the fourth film. Also, the fifth film has a lower dielectric constant than the fourth film. The fourth film corresponds to the protective insulating film 410 in the fourth embodiment. The fifth film corresponds to the interlayer insulating layer 420, specifically first insulating layer 421, in the fourth embodiment. The relationship between the fourth and fifth films of the fourth embodiment is similar to the relationship between the first and second films of the first embodiment.

Fifth Embodiment

Figure 7B:
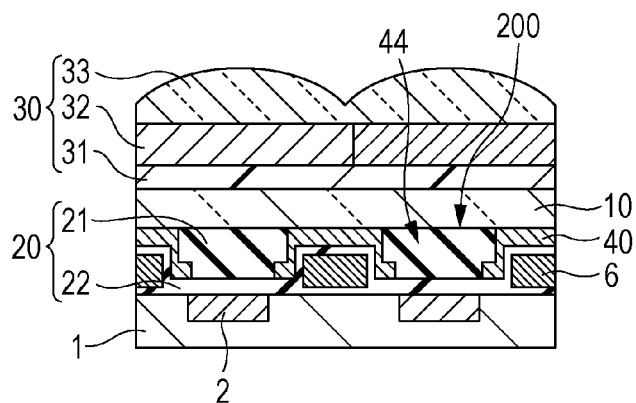
FIG. 7B is a schematic sectional view of a fifth embodiment of the invention.

A fifth embodiment will be described with reference to FIG. 7B. While the first to fourth embodiments are applied to CMOS image sensors, the present embodiment will be applied to a charge-coupled device (CCD) image sensor. Parts similar to those described with respect to the first to fourth embodiments are designated by the same reference numerals, and will not be further described in detail.

Transfer electrodes 6 of CCDs are disposed between a light-shielding film 40 and a substrate 1. The transfer electrodes are covered with the light-shielding film 40. This structure can reduce noise caused by light entering the charge-coupled devices. The second layer 22 of the second film 20 is disposed between the light-shielding film 40 and the transport electrodes 6 so as to cover each of the transport electrodes 6.

In the present embodiment the interface 200 between the first film 10 and the second film 20 coincides with the entrances 441 of the transit portions 44 and lies in the same plane, parallel to the principal plane 100, as the upper surface 41 of the light-shielding film 40.

Manufacturing Method

A method for manufacturing the image sensing device of the first embodiment will be described with reference to FIGS. 8A to 10J. In this method, the light-shielding film 40 is embedded in the first layer 21 of the second film 20 by a dual-Damascene process.

Step (a)

Figure 8A:
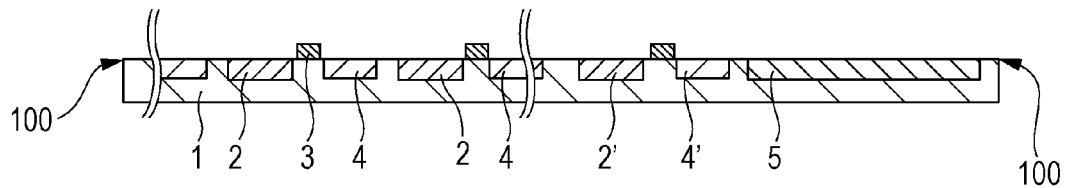
FIGS. 8A to 8D are schematic sectional views of process steps of a method for manufacturing an image sensing device according to an embodiment of the invention.

Step (a) will be described with reference to FIG. 8A. Photoelectric conversion portions 2 for light-receiving pixels and photoelectric conversion portions 2' for light-shielding pixels are formed in a substrate 1. Pixel circuit portions 4 for the light-receiving pixels, pixel circuit portions 4' for the light-shielding pixels, and a peripheral circuit portion 5 are also formed in the substrate 1. These can be formed by doping the substrate 1 by, for example, ion implantation. In addition, polysilicon control electrodes 3 are formed on the substrate 1.

Step (b)

Figure 8B:
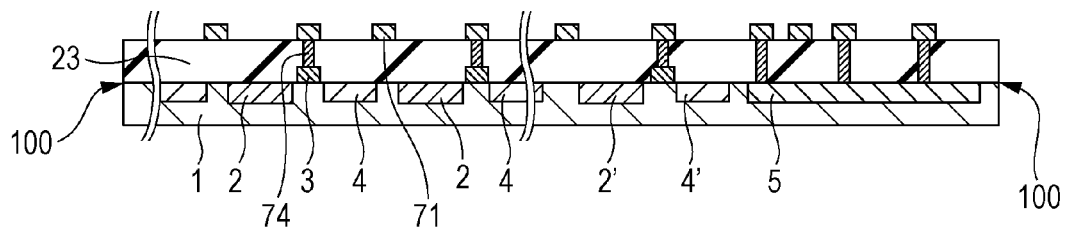

Step (b) will be described with reference to FIG. 8B. The third layer 23 of the second film 20 is formed on the substrate 1 so as to cover the photoelectric conversion portions 2 and 2', pixel circuits 4 and 4', and the peripheral circuit portion 5 by a deposition method, such as thermal chemical vapor deposition (CVD) or plasma CVD. The materials described in the first to fifth embodiments can be used.

Contact holes are formed in the third layer 23, and first plugs (contact plugs) 74 are formed in the contact holes by CMP. The first plugs 74 are connected to the gate, source and drain of the transistor of each of the pixel circuit portions 4 and 4' and peripheral circuit portion 5 in the substrate 1. The first wiring pattern 71 is formed by patterning so as to be connected to the first plugs 74.

Step (c)

Figure 8C:
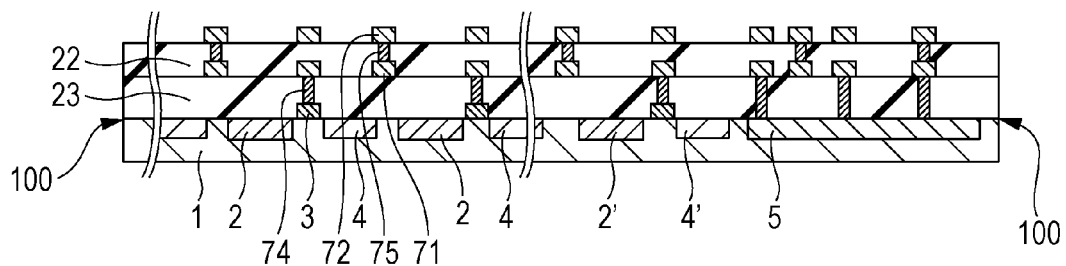

Step (c) will be described with reference to FIG. 8C. The second layer 22 of the second film 20 is formed of silicon oxide to cover the first wiring pattern 71 by thermal CVD or plasma CVD. After the second layer 22 is planarized by CMP, via holes are formed in the second layer 22. The via holes are filled by forming a metal film on the second layer 22, and thus second plugs (via plugs) 75 are formed in the second layer 22 by CMP. The second plugs 75 are connected to the first wiring pattern 71. As with the first wiring pattern 71 formed in Step (b), the second wiring pattern 72 is formed by patterning so as to be connected to the first plugs 75.

Step (d)

Figure 8D:
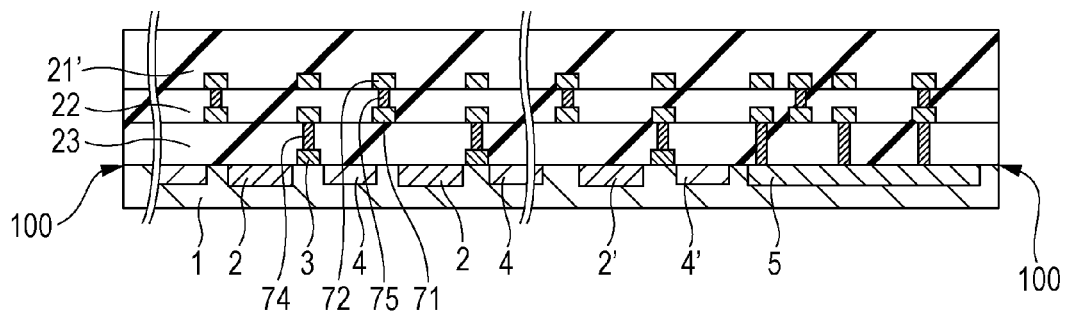

Step (d) will be described with reference to FIG. 8D. A first layer precursor 21' is formed of silicon oxide so as to cover the second wiring pattern 72 and the second layer 22 by thermal CVD or plasma CVD. The first layer precursor 21' may be planarized in this step, or the planarization may be omitted. The above-described Steps (a) to (d) may also be performed by other manufacturing techniques.

Step (e)

Figure 9E:
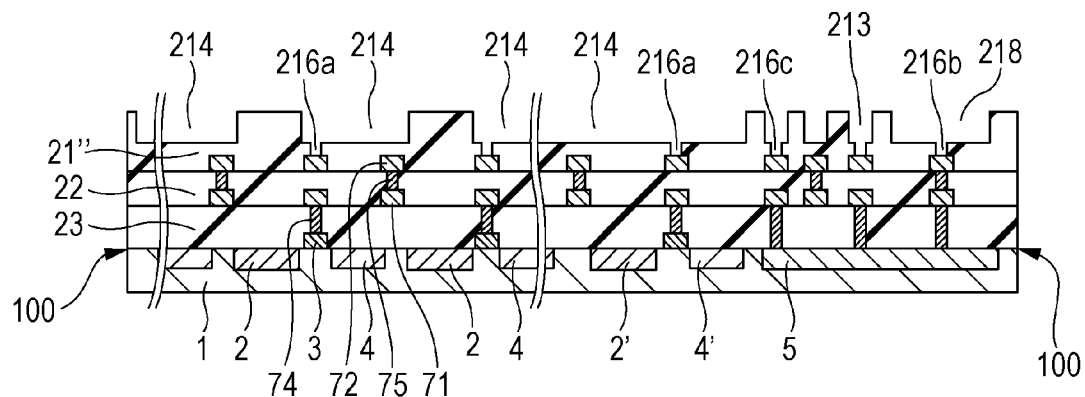
FIGS. 9E to 9G are schematic sectional views of subsequent process steps of the method shown in FIGS. 8A to 8D.

Step (e) will be described with reference to FIG. 9E. The first layer precursor 21' is provided therein with trenches 214, which are recesses used for forming the light-shielding film 40 embedded in the first layer 21, and via holes 216a used for forming third plugs 76 in the first layer 21. In this step, other trenches 213 and 216 may be formed simultaneously with these trances 214. Trench 218 is used for embedding the electrode pads 80 in the first layer 21, and trench 213 is used for embedding the third wiring pattern 73 in the first layer 21. Also, other via holes 216b and 216c may be formed simultaneously with the via holes 216a. Via hole 216b is used for forming the third plug 76 that will connect the electrode pad 80 and the second wiring pattern 72, and via hole 216c is used for forming the third plug 76 that will connect the third wiring pattern 73 and the second wiring pattern 72. Thus an uneven first layer precursor 21" having recesses (corresponding to the trenches and the via holes) is formed.

Step (f)

Figure 9F:
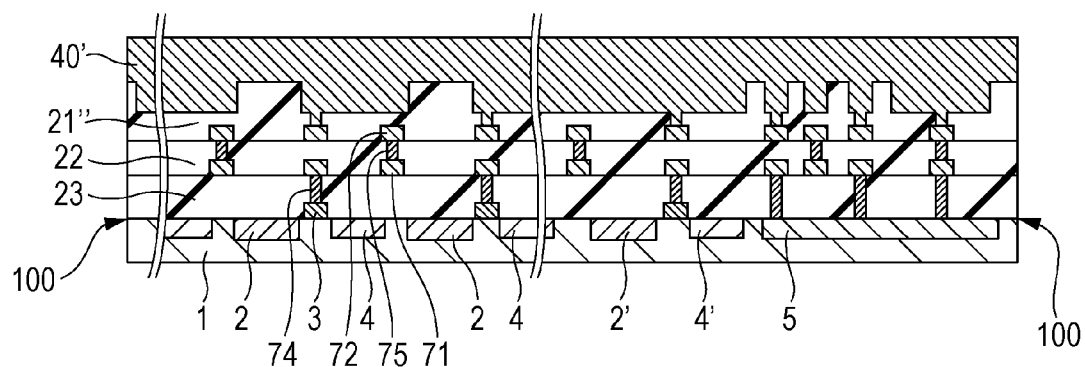

Step (f) will be described with reference to FIG. 9F. The trenches 214, 213 and 218 and the via holes 216a to 216c in the uneven first layer precursor 21" are filled with the material of the light-shielding film 40 by sputtering, vapor deposition or other processes. The material of the light-shielding film 40 can be selected from silver-color materials. For example, an aluminum-based material may be used, such as Al, Al—Si, or Al—Cu. In this step, the silver-color material is deposited on the entire surface of the uneven first layer precursor 21" (including the outside of the trenches and via holes) to form a silver-color material film 40'.

The silver-color material film 40' may be reflowed as needed. By employing a deposition process that can facilitate reflowing, the via holes and trenches can be satisfactorily filled even if these recesses are very small. An exemplary operation in Step (f) will be described. A titanium nitride layer (not shown) and a titanium layer (not shown) are deposited in that order on the internal walls of the trenches and via holes by sputtering. A silver-color material, or an aluminum layer, is deposited on the titanium layer by sputtering with the substrate 1 kept at a relatively low temperature (for example, may be at room temperature). Subsequently, the substrate 1 is heated to about 400 to 500° C., and the silver-color material is further deposited and allowed to stand at about 400 to 500° C. for a predetermined time (for example, several minutes). The aluminum layer is then reflowed. The titanium nitride layer inhibits the aluminum layer from reacting with the silicon oxide layer (uneven first layer precursor 21"), and the titanium layer facilitates the reflow of the aluminum layer.

Step (g)

Figure 9G:
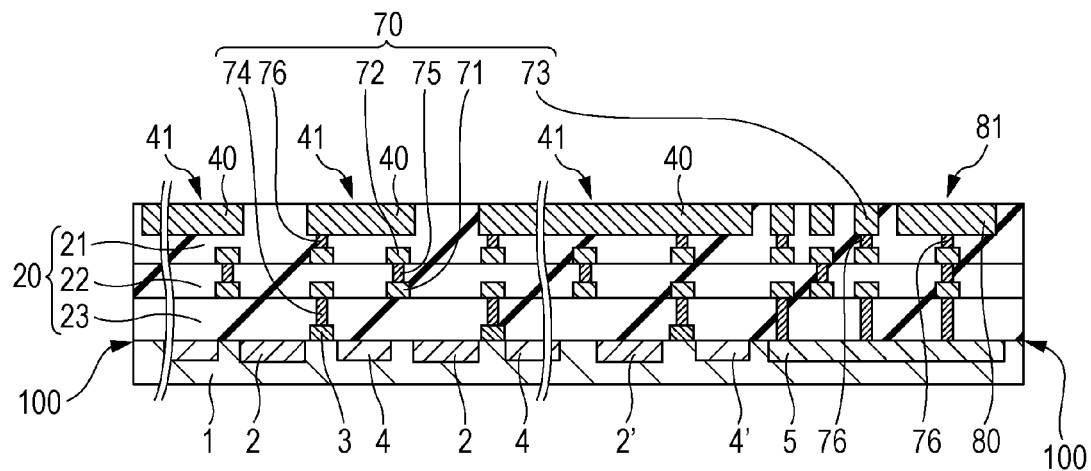

Step (g) will be described with reference to FIG. 9G. The silver-color material film 40' is polished by CMP, at least until the uneven first layer precursor 21" is exposed. Thus the silver-color upper surface 41 of the light-shielding film 40 is formed. The upper surface 41 of the light-shielding film 40 is mirror-finished by CMP. The first layer 21 of the second film 20 is thus completed from the uneven first layer precursor 21". The uneven first layer precursor 21" is preferably polished as well so that the first layer 21 and the upper surface 41 of the light-shielding film 40 are continued smoothly without steps. In this step, the electrode pads 80 are simultaneously formed and their upper surfaces 81 are defined.

When the silver-color material film 40' is mainly formed of aluminum, slurry and polishing cloth for the CMP, which are on the market, can be conveniently used. For example, MSW-1000 or XJFW-8048H, each produced by RDOel, may be used as a slurry for the CMP. Also, IC-1000 produced by RDOel may be used as a polishing cloth for the CMP.

The conditions of the CMP may be changed as needed for dishing of the upper surface of the light-shielding film 40 so that concave portions can be formed in the upper surface 41 of the light-shielding film 40, as in the fifth configuration of the second embodiment. Similarly, the fourth configuration of the second embodiment can also be achieved by changing the CMP conditions for dishing of the interface 200 to form concave interfaces 200.

The first layer 21 is thus completed in which the light-shielding film 40 (and the third wiring pattern 73 and the electrode pads 80) are embedded, and thus, the second film 20 including the first, second and third layers 21, 22 and 23 is completed.

Step (h)

Step (h) will be described with reference to FIG. 10H. The first film 10 including a silicon nitride layer is formed so as to cover the upper surface 41 of the light-shielding film 40 and the exposed first layer 21 of the second film 20 by plasma CVD. The first film 10 also covers the upper surfaces 81 of the electrode pads 80. Since the upper surface 41 of the light-shielding film 40 and the upper surface of the first layer 21 have been planarized (and smoothed) in Step (g), the planarization of the first film 10 may be omitted.

From the viewpoint of reducing dark current by hydrogen sintering, the silicon nitride layer of the first film 10 preferably contains hydrogen. Hydrogen can be introduced into the silicon nitride layer by adding hydrogen to the gas used for plasma CVD performed for forming the silicon nitride layer.

Figure 6B:
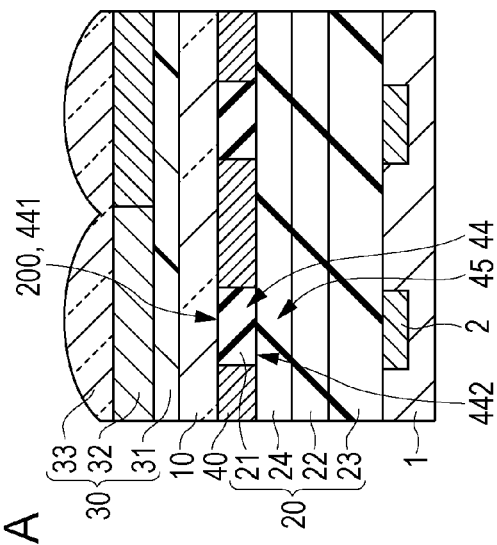
FIG. 6B is a schematic sectional view of a second configuration according to the third embodiment.
Figure 6C:
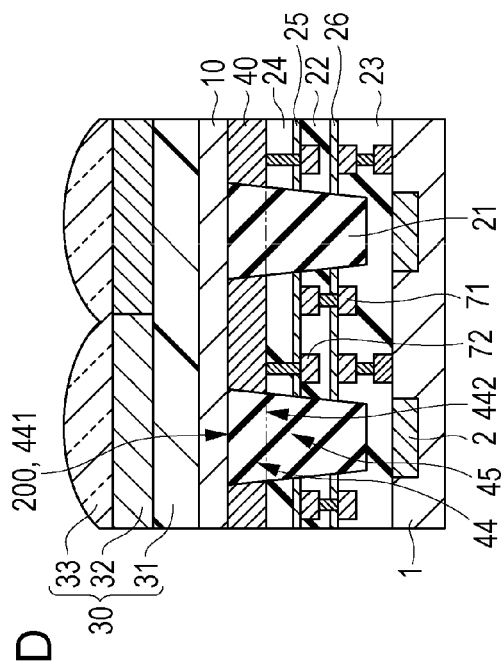
FIG. 6C is a schematic sectional view of a third configuration according to the third embodiment.
Figure 6D:
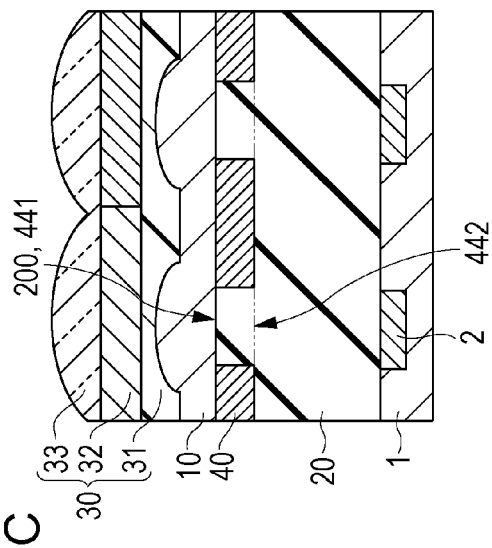
FIG. 6D is a schematic sectional view of a fourth configuration according to the third embodiment.

The first film 10 may include a plurality of layers in such a manner that a silicon oxynitride layer (first intermediate-refractive-index layer 11) is disposed between the silicon nitride layer (different-refractive-index layer 12) and a silicon oxide layer (first layer 21 of the second film 20), as described in the second form of the third embodiment with reference to FIG. 6B.

Figure 10H:
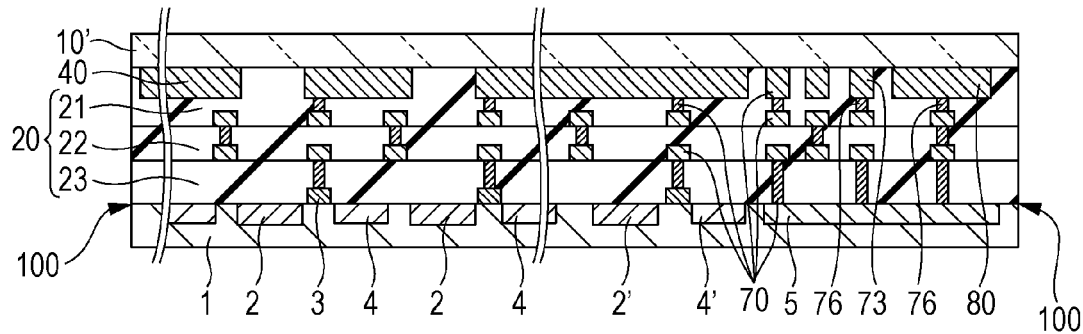
FIGS. 10H to 10J are schematic sectional views of subsequent process steps of the method shown in FIGS. 9E to 9G.

The first film 10 is formed so as to cover the pixel region and further extends over the peripheral circuit region, as shown in FIG. 10H.

Step (i)

Step (i) will be described with reference to FIG. 10I. The intermediate layer 31 is formed of a resin so as to cover the first film 10 by coating.

In addition, the color filter layer 32 is formed on the intermediate layer 31. A resin intermediate layer is formed on the color filter layer 32. Then, the microlens layer 33 is formed of a resin over the color filter layer 32.

Thus, the third film 30 including the intermediate layer 31, the color filter layer 32 and the microlens layer 33 is completed.

Figure 10I:
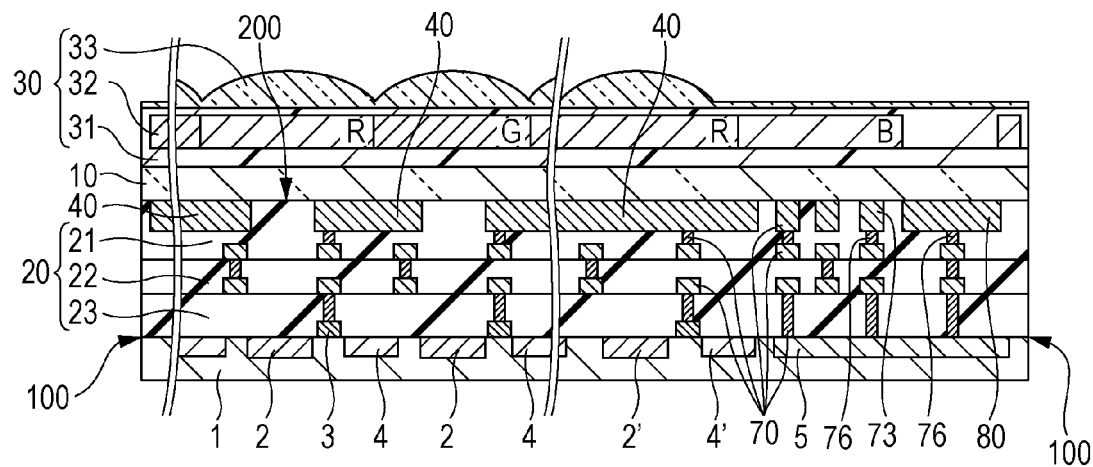

The third film 30 is formed so as to cover the pixel region, and further extends over the peripheral circuit region, as shown in FIG. 10I.

Step (j)

Figure 10J:
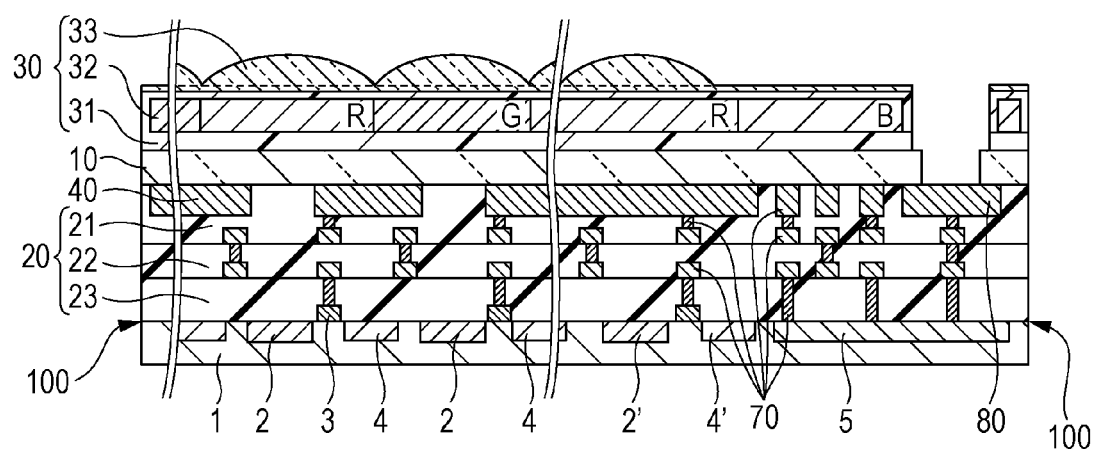

Step (j) will be described with reference to FIG. 10J. The upper surfaces 81 of the electrode pads 80 are exposed again by partially etching the third film 30 and the first film 10. At this time, the first film 10 is etched so as to overlap the edges of the upper surfaces 81 of the electrode pads 80. By overlapping the edges of the upper surfaces 81 and the first film 10 acting as a passivation film, moisture penetration of the inside of the image sensing device through the electrode pads 80 can be suppressed.

Thus, the image sensing device 1000 of the first embodiment can be produced by the above-described manufacturing method. If the third plugs 76 are not connected to the light-shielding film 40, the light-shielding film 40 may be formed by a single Damascene process. A fourth layer 24 of the second film 20 may be formed before Step (d) in which the first layer 21 is formed, and then the third plugs 76 in the fourth layer 24 and the light-shielding film 40 (and the third wiring pattern 73 and the electrode pads 80) in the first layer 21 are formed by a single Damascene process. In the above method, an aluminum-based material is used for forming the silver-color material film 40', but the silver-color material is not limited to an aluminum-based material. For example, tungsten is also suitable as the silver-color material because it is easy to embed.

Other methods may be applied to produce the image sensing device of the first embodiment.

For example, after Step (c), the fourth layer 24 may be formed of silicon oxide so as to cover the second wiring pattern 72 and the second layer 22 by thermal CVD or plasma CVD. The light-shielding film 40 is formed on the fourth layer 24 by combination of photolithography and dry etching. The fourth layer 24 and the light-shielding film 40 are covered with a silicon oxide layer for forming the first layer 21. The silicon oxide layer may be planarized by an etch back method or CMP.

In an etch back method, a planarization sacrifice layer is formed of spin-on-glass (SOG) on the silicon oxide layer. The planarization sacrifice layer and the silicon oxide layer are etched (etched back) under the conditions where these layers can be etched at substantially the same etching rate. When the etching of the planarization sacrifice layer and the silicon oxide layer is performed so that the silicon oxide layer remains thin (a thickness of $\lambda/N$ or less, where N represents the refractive index of the silicon oxide layer) on the light-shielding film 40, a structure like the second configuration of the second embodiment is formed. When the etching (etch back) is stopped at the time when the silicon oxide layer on the light-shielding film 40 has been completely removed, the same structure as in the first embodiment is formed except for the interface between the first layer 21 and the fourth layer 24 coincides with the exit 442 of the transit portion 44. When the etching (etch back) is performed until the side walls 43 of the light-shielding film 40 are exposed, the structure like the first configuration of the second embodiment is formed.

In CMP, when the silicon oxide layer is polished by CMP so as to remain thin on the light-shielding film 40, a structure like the second configuration of the second embodiment is formed. In this instance, the thickness of the remaining silicon oxide layer is adjusted to $\lambda/N$ or less ($\lambda$ represents the wavelength of incoming light, and N represents the refractive index of the silicon oxide layer). When the silicon oxide layer is polished by CMP until the upper surface 41 of the light-shielding film 40 is exposed, the same structure as in the first embodiment is formed except for the interface between the first layer 21 and the fourth layer 24 coincides with the exit 442 of the transit portion 44.

Either planarization method allows the same procedure as the above-described manufacturing method for the process subsequent to Step (h). Thus, the image sensing device of the first embodiment is produced.

An image sensing system including an image sensing device will now be described as an application of the image sensing devices of the above-described embodiments. The image sensing system may be an apparatus intended to take images, such as a camera, or other apparatuses having an additional function to take images, such as a personal computer or a personal digital assistant (PDA). The image sensing system includes the image sensing device of an embodiment of the invention, and a signal processing unit that processes signals transmitted from the image sensing device. The signals can be transmitted through the electrode pads 80 of the image sensing device. The signal processing unit may include a processor that generates image data from the signals transmitted from the image sensing device and corrects the image data. The image sensing system also includes a display unit on which images taken by the image sensing device are displayed. The image sensing system also includes a memory device in which images taken by the image sensing device are stored. These components, that is, image sensing device, the signal processing unit, the display unit and the memory device, may be housed together in a single enclosure, or one or some of the components may be housed in another enclosure. The components may each be placed independently with interactive communication established therebetween. An image sensing system that can take images at desired places may be structured by installing the image sensing device in a transporting apparatus, such as a vehicle, a ship or an airplane.

In the image sensing device according to embodiments of the invention, the influence of light reflected from the light-shielding film can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-173963 filed Aug. 9, 2011, which is hereby incorporated by reference in its entirety.

What is claimed is:

1. An image sensing device comprising:
   a substrate having a plurality of photoelectric conversion portions;
   a first film disposed over the substrate, the first film covering the photoelectric conversion portions;
   a light-shielding film disposed between the first film and the substrate, the light-shielding film having apertures for the photoelectric conversion portions, each of the apertures acting as a transit portion through which visible light enters a corresponding photoelectric conversion portion, the light-shielding film having an upper surface and a side wall, the upper surface facing the first film such that the first film is closely adjacent to the upper surface, and the side wall facing the transit portion; and
   a second film disposed between the first film and the substrate, the second film comprising a first layer having a refractive index different from the first film, the first layer lying within at least the transit portions, and the first layer forming interfaces with the first film,
   wherein at least one of the upper surface and the side wall comprises a material having maximum spectral reflectance for visible light of 75% or less, and the upper surface comprises a material having minimum spectral reflectance for visible light of ¾ or more of the maximum, and
   wherein the distance between the interface and the corresponding photoelectric conversion portion is greater than the distance between the photoelectric conversion portion and the lower end of the corresponding transit portion.

2. The image sensing device according to claim 1, wherein the refractive index of the first film is higher than the refractive index of the first layer.

3. The image sensing device according to claim 1, wherein the material of the upper surface is different from the material of the side wall.

4. The image sensing device according to claim 1, wherein at least one of the following conditions (a) to (e) is satisfied:
   (a) the first film is in contact with the upper surface of the light-shielding film;
   (b) the first film is separate from the side wall of the light-shielding film;
   (c) the interface between the first film and the first layer coincides with the upper end of the transit portion;
   (d) the upper surface of the light-shielding film is at least partially concave; and
   (e) a part of the first layer lies between the light-shielding film and the substrate.

5. The image sensing device according to claim 1, further comprising:
   a third film covering and in contact with the first film, the third film having a lower refractive index than the first film,
   wherein the optical length between the light-shielding film and the third film is in the range of $\lambda/2$ to $4\lambda$, where $\lambda$ represents the dominant wavelength of incident light on the upper surface of the light-shielding film.

6. The image sensing device according to claim 1, wherein at least one of the following conditions (f) to (j) is satisfied:
   (f) the second film comprises a second layer having a refractive index different from the first layer;
   (g) the first film comprises a different-refractive-index layer having a refractive index different from the first layer, an intermediate-refractive-index layer disposed between the different-refractive-index layer and the first layer and having a refractive index between the refractive indices of the different-refractive-index layer and the first layer;
   (h) the image sensing device further comprises a third film comprising an organic material, covering and in contact with the first film, and the first film comprises an inorganic multilayer structure comprising a different-refractive-index layer having a refractive index different from the third film, and an intermediate-refractive-index layer disposed between the different-refractive-index layer and the third film and having a refractive index between the refractive indices of the different-refractive-index layer and the third film;
   (i) the first film has a convex lens shape; and
   (j) the second film has an optical waveguide structure.

7. The image sensing device according to claim 1, further comprising:
   for each photoelectric conversion portion, a microlens layer comprising a plurality of lens portions arranged in contact with each other; and
   a color filter layer disposed between the microlens layer and the light-shielding film, the color filter layer having different spectral characteristics for each photoelectric conversion portion.

8. The image sensing device according to claim 1, further comprising:
   an electrode pad in a peripheral circuit region,
   wherein the electrode pad and the light-shielding film lie in the same plane parallel to the substrate.

9. The image sensing device according to claim 1, further comprising:
   a wiring pattern disposed in a peripheral circuit region, the wiring pattern and the light-shielding film lying in the same plane parallel to the substrate,
   wherein the first film extends to the peripheral circuit region, and an insulating layer in the peripheral circuit region lies in the same plane as the wiring pattern and the light-shielding film and is in contact with the first film, and
   wherein the first film has a higher dielectric constant than the insulating layer.

10. The image sensing device according to claim 1, wherein the light-shielding film covers a portion of the plurality of photoelectric conversion portions.

11. The image sensing device according to claim 1, wherein the first film comprises at least one of a silicon nitride layer and silicon oxynitride layer, and the first layer is a silicon oxide layer.

12. The image sensing device according to claim 1, wherein the upper surface comprises a metal material mainly comprising a metal selected from a first group consisting of aluminum, titanium, vanadium, chromium, manganese, cobalt, nickel, molybdenum, ruthenium, rhodium, palladium, silver, hafnium, tantalum, tungsten, iridium, and platinum, or a metal compound mainly comprising a compound selected from a second group consisting of titanium silicide, cobalt silicide, nickel silicide, tungsten silicide, and platinum silicide.

13. An image sensing system comprising:
the image sensing device according to claim 1; and
a signal processing unit that processes signals transmitted from the image sensing device.

14. An image sensing device comprising:
a substrate having a plurality of photoelectric conversion portions;
a first film disposed over the substrate, the first film covering the photoelectric conversion portions;
a light-shielding film disposed between the first film and the substrate, the light-shielding film having apertures for the photoelectric conversion portions, the apertures each acting as a transit portion through which visible light enters the corresponding photoelectric conversion portion, the light-shielding film having an upper surface and a side wall, the upper surface facing the first film such that the first film is closely adjacent to the upper surface, and the side wall facing the transit portion; and
a second film disposed between the first film and the substrate, the second film comprising a silicon oxide layer, the silicon oxide layer lying within at least the transit portions, the silicon oxide layer forming interfaces with the first film, wherein the upper surface mainly comprises aluminum and the side wall mainly comprises titanium or titanium nitride, or the upper surface mainly comprises tungsten, and wherein the distance between the interface and the corresponding photoelectric conversion portion is greater than the distance between the photoelectric conversion portion and the lower end of the corresponding transit portion.

15. The image sensing device according to claim 14, wherein at least one of the following conditions (a) to (e) is satisfied:
(a) the first film is in contact with the upper surface of the light-shielding film;
(b) the first film is separate from the side wall of the light-shielding film;
(c) the interface between the first film and the silicon oxide layer coincides with the upper end of the transit portion;
(d) the upper surface of the light-shielding film has concave portions; and
(e) a part of the silicon oxide layer lies between the light-shielding film and the substrate.

16. The image sensing device according to claim 15, wherein the first film has a convex lens shape and the second film has an optical waveguide structure.

17. An image sensing system comprising:
the image sensing device according to claim 15; and
a signal processing unit that processes signals transmitted from the image sensing device.

* * * * *